(12) United States Patent  (10) Patent No.: US 7,423,295 B2
Yamazaki et al.  (45) Date of Patent: Sep. 9, 2008

(54) LIGHT EMITTING DEVICE AND ELEMENT SUBSTRATE

(75) Inventors: Yu Yamazaki, Kanagawa (JP); Aya Anazai, Kanagawa (JP); Ryota Fukumoto, Kanagawa (JP); Mitsuaki Osame, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/675,163

(22) Filed: Feb. 15, 2007

(65) Prior Publication Data

US 2007/0138479 A1 Jun. 21, 2007

Related U.S. Application Data

(63) Continuation of application No. 10/859,998, filed on Jun. 4, 2004, now Pat. No. 7,180,245.

(30) Foreign Application Priority Data

Jun. 11, 2003 (JP) ............................. 2003-166418

(51) Int. Cl.
 *H01L 33/00* (2006.01)
(52) U.S. Cl. .................. 257/89; 257/E27.134
(58) Field of Classification Search .............. 257/89, 257/E27.134
See application file for complete search history.

(56) References Cited

U.S. PATENT DOCUMENTS

| 6,229,506 | B1 | 5/2001 | Dawson |
| 6,229,508 | B1 | 5/2001 | Kane |
| 6,661,180 | B2 | 12/2003 | Koyama |
| 7,218,294 | B2 * | 5/2007 | Koyama et al. ............... 345/76 |
| 2002/0047568 | A1 | 4/2002 | Koyama |

FOREIGN PATENT DOCUMENTS

JP 2002-108285 4/2002

* cited by examiner

*Primary Examiner*—Howard Weiss
(74) *Attorney, Agent, or Firm*—Fish & Richardson P.C.

(57) ABSTRACT

The invention provides a light emitting device using transistors manufactured by the conventional process while reducing an area occupied by capacitors, whereby variations in luminance of light emitting elements caused by variations in gate voltage Vgs of the transistors are suppressed, and a luminance decay of the light emitting elements due to the degradation of light emitting materials and variations in luminance can also be suppressed. The light emitting device includes a first transistor for controlling a video signal input to a pixel, second and third transistors one of which is turned ON while the other is turned OFF according to a potential of the video signal, and a fourth transistor for supplying current to a light emitting element according to each drain potential of the second and third transistors, wherein the drains of the second and third transistors are connected to each other, the third and fourth transistors have the same conductivity, and the sources of the third and fourth transistors are connected to each other.

45 Claims, 13 Drawing Sheets

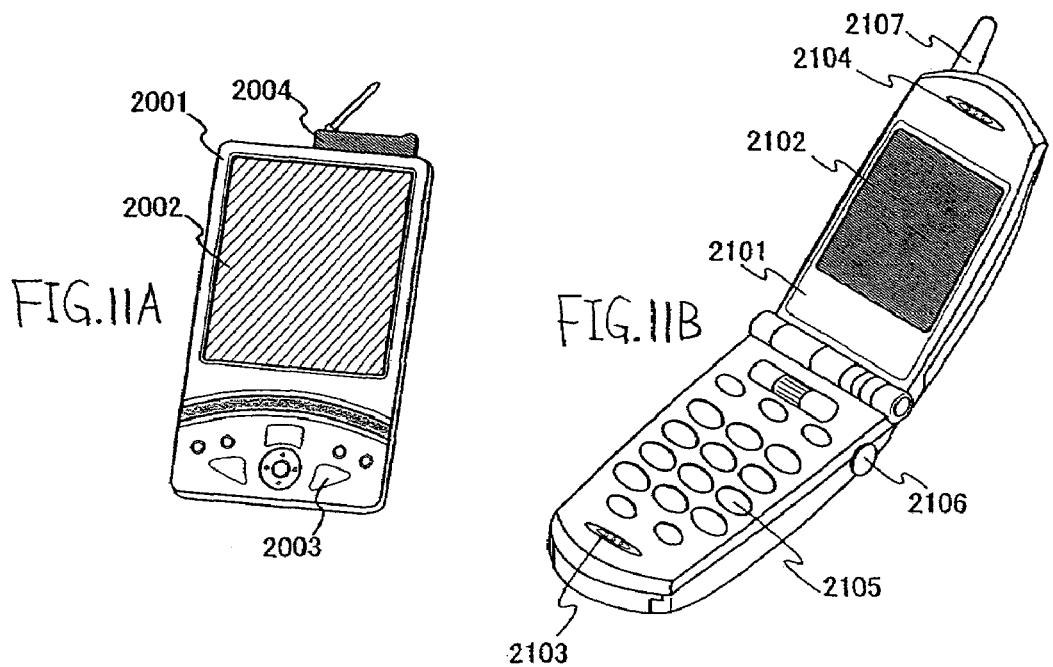
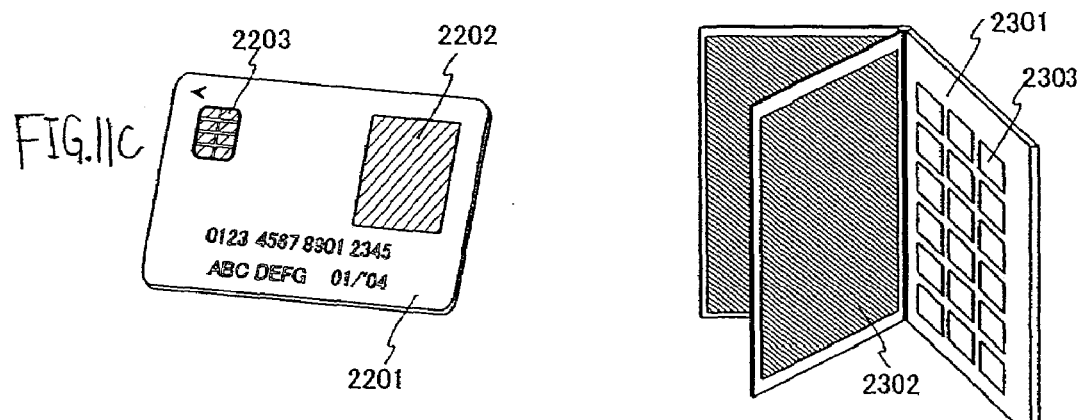
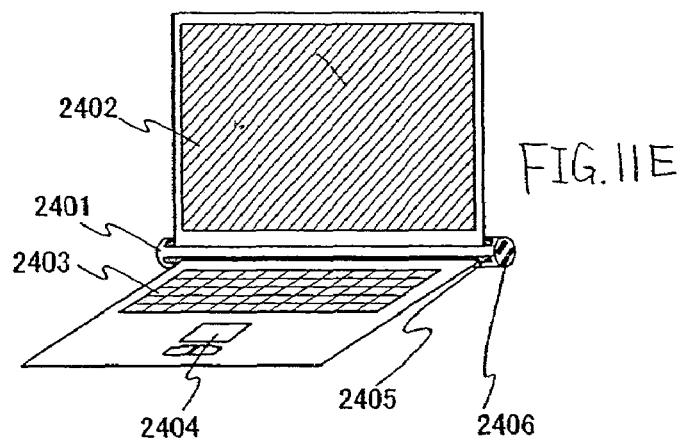

LIGHT EMITTING DEVICE AND ELEMENT SUBSTRATE

BACKGROUND OF THE INVENTION

1. Field of the Invention

The present invention relates to a light emitting device comprising a plurality of pixels each including a light emitting element and a unit for supplying current to the light emitting element.

2. Description of the Related Art

Since a light emitting element emits light by itself, it is highly visible and does not require a back light which is needed in a liquid crystal display device (LCD). Therefore, it is suitably applied to thin devices and not restricted in viewing angles. Because of these advantages, a light emitting device having light emitting elements has recently been drawing attentions as an alternative display device to a CRT and an LCD, and practically applied to an electronic device such as a mobile phone or a digital still camera.

The light emitting device can be classified into a passive matrix type and an active matrix type. The active matrix light emitting device can maintain a current supply to a light emitting element to some extent even after a video signal input, therefore, a larger size and higher definition of a panel can be realized, which is becoming the mainstream in recent years. The specific pixel configurations of an active matrix light emitting device which are proposed are different among manufacturing corporations of light emitting devices, and various technologies with distinctive characteristics have been studied and developed by them. Typically, a pixel includes at least a light emitting element, a transistor for controlling a video signal input to the pixel, and a transistor for supplying current to the light emitting element.

As an obstruction to the practical application of the light emitting device, a luminance decay due to degradation of light emitting materials can be noted. The rate of degradation of the light emitting materials depends on the emission period or the current amount supplied to the light emitting element. Therefore, when a gray scale differs among pixels in each displayed image, the rate of degradation of the light emitting elements vary among pixels, leading to variations in luminance. Patent Document 1 discloses a method for suppressing the luminance decay by maintaining drain current of a transistor for controlling a current amount supplied to a light emitting element constant when it is ON regardless of the degradation of a light emitting layer by operating the transistor in a saturation region.

Patent Document 1

Japanese Patent Laid-Open No. 2002-108285

However, drain current of a transistor operating in a saturation region is largely influenced by small variations in its gate-source voltage (gate voltage) Vgs, which varies luminance of a light emitting element. Therefore, when operating the transistor in a saturation region, its gate voltage Vgs has to be prevented from varying while the light emitting element emits light.

However, when OFF-current of a transistor for controlling a video signal input to a pixel is large, its gate voltage Vgs easily varies with the potential change of a video signal which is input to other pixels. In order to prevent the variations of the gate voltage, it is required that the storage capacity of a capacitor disposed between the gate and source of the transistor is increased or OFF-current of the transistor for controlling a video signal input to a pixel is suppressed low. However, the area occupied by the capacitor is preferably small in order to prevent leak current between electrodes due to the dust or drop in yield. Further, it is quite difficult to optimize the manufacturing process of a transistor so as to suppress OFF-current of a transistor for controlling a video signal input to a pixel low and to increase ON-current of the transistor to charge large capacitance since it requires high cost and time. Further, the gate voltage Vgs of the transistor for controlling a current amount supplied to a light emitting element easily varies with the switching of other transistors or the potential change in a signal line and a scan line due to the parasitic capacitance of the gate of the transistor.

SUMMARY OF THE INVENTION

In view of the foregoing problems, the invention provides a light emitting device using transistors which are manufactured by the conventional process while reducing an area occupied by capacitors, whereby variations in luminance of light emitting elements caused by variations in gate voltage Vgs of transistors for controlling a current amount supplied to the light emitting elements are suppressed, and a luminance decay of the light emitting elements due to the degradation of light emitting materials and variations in luminance can also be suppressed.

The light emitting device of the invention comprises pixels each including at least a light emitting element, a first transistor (switching transistor) for controlling a video signal input to the pixel, second and third transistors (first current controlling transistor and second current controlling transistor) whose drains are connected to each other, and a fourth transistor (driving transistor) for controlling a current amount supplied to the light emitting element according to each drain potential of the second and third transistors.

Each of the second and third transistors operates in such a manner that either one is turned ON while the other is turned OFF. Specifically, the second transistor and the third transistor have the opposite conductivity, and the third transistor and the fourth transistor have the same conductivity.

The source of the second transistor is supplied with at least binary potentials (first potential and second potential) by a driver circuit, the source of the third transistor is supplied with a fixed potential (third potential), and the source of the fourth transistor is supplied with a fixed potential (fourth potential). The level of the fixed potential (third potential) which is supplied to the source of the third transistor may be equal to or different from that of the fixed potential (fourth potential) which is supplied to the source of the fourth transistor. In either case, the levels of the third and fourth potentials are set so that the fourth transistor is turned OFF when the third potential is supplied to the gate of the fourth transistor by the third transistor. Meanwhile, the level of the first potential is set so that the fourth transistor is turned ON when the first potential is supplied to the gate of the fourth transistor by the second transistor. On the other hand, the level of the second potential is set so that the fourth transistor is turned OFF when the second potential is supplied to the gate of the fourth transistor by the second transistor.

According to the invention, the first to third transistors operate in a linear region while the fourth transistor operates in a saturation region. The operation region (linear region or saturation region) of the transistor can be determined by a potential supplied to each terminal of the source, drain, and gate of each transistor.

As described above, according to the invention, the gate of the driving transistor is not supplied with a potential of a video signal, but supplied with each drain potential of the first and second current controlling transistors whose switching is controlled according to the potential of the video signal.

According to the foregoing configuration, the gate voltage Vgs of a driving transistor in a pixel is prevented from varying due to the potential change of a video signal which is input to other pixels. Also, by operating the driving transistor in a saturation region, its drain current can be determined only by Vgs without being influenced by the source-drain voltage (drain voltage) Vds. That is, the first and second current controlling transistors only select whether or not to supply current to the light emitting element, and a current amount supplied to the light emitting element is determined by the driving transistor which operates in a saturation region.

Therefore, it is possible to prevent current supplied to the light emitting element from varying easily without increasing the storage capacity of the capacitor which is disposed between the gate and source of the transistor or optimizing a manufacturing process of a transistor so as to suppress OFF-current of the transistor for controlling a video signal input to a pixel low. Thus, cause of variations is reduced and the image quality is thus enhanced to a great extent.

Also, by operating the driving transistor in a saturation region, its drain current is maintained relatively at a constant value even when the Vds becomes smaller due to the degradation of the light emitting element in place of the voltage Vel increasing, which is applied between the electrodes of the light emitting element. Therefore, a luminance decay is suppressed low even when the light emitting element degrades. Further, since it is not necessary to optimize the manufacturing process of a transistor in order to suppress OFF-current of the transistor for controlling a video signal input to a pixel low, the process can be simplified, leading to the cost reduction and improvement in yield.

It should be noted that L (channel length) of the driving transistor may be longer than W (channel width) thereof, and each L of the first and second current controlling transistors may be each equal to or shorter than W thereof. More preferably, the ratio of the L to W of the driving transistor is five or more. According to the foregoing structure, variations in luminance of light emitting elements among pixels can be further suppressed. Further, provided that L of the driving transistor is L1 and W thereof is W1, and L of the first and second current controlling transistors is L2 and W thereof is W2, when L1/W1:L2/W2=X:1, X is desirably from 5 to 6000. When X=6000 for example, it is desirable that L1/W1=500 μm/3 μm and L2/W2=3 μm/100 μm.

In addition, a light emitting element in this specification indicates an element whose luminance is controlled by current or voltage, and it includes an OLED (Organic Light Emitting Diode), an MIM electron source element (electron discharge element) which is used in an FED (Field Emission Display), and the like.

Also, the light emitting device of the invention includes a panel including light emitting elements and a module obtained by mounting an IC or the like including a controller onto the panel. More generally, the invention relates to an element substrate which corresponds to a condition before the completion of light emitting elements in manufacturing steps of the light emitting device, and the element substrate comprises a plurality of pixels each including a unit for supplying current to a light emitting element.

An element substrate corresponds to a condition before the completion of light emitting elements in manufacturing steps of the light emitting device of the invention. Specifically, it may be a condition in which only a pixel electrode of the light emitting element is formed, the condition after a conductive film to be a pixel electrode is deposited and before it is patterned to form the pixel electrode, or the like.

An OLED (Organic Light Emitting Diode) includes an anode layer, a cathode layer, and a layer containing a light emitting material (hereinafter referred to as a light emitting layer) that generates luminescence (electroluminescence) when an electric field is applied thereto. The light emitting layer is provided between the anode and the cathode, and it comprises a single or multiple layers. These layers may contain an inorganic compound. The electroluminescence in the light emitting layer includes luminance (fluorescence) that is generated when an excited singlet state returns to a ground state and luminance (phosphorescence) that is generated when an excited triplet state returns to a ground state.

A transistor used in the light emitting device of the invention may be a thin film transistor using polycrystalline silicon or amorphous silicon. However, the invention is not limited to thin film transistors and it may be a transistor formed by using single crystalline silicon or an SOI, or a transistor using an organic semiconductor or a carbon nanotube. In addition, a transistor disposed in a pixel of the light emitting device of the invention may be a single-gate transistor, a double-gate transistor, or a multi-gate transistor having more than two gate electrodes.

According to the configuration of the invention as set forth above, current supplied to the light emitting element is prevented from varying even without increasing the storage capacity of the capacitor which is disposed between the gate and source of the first and second current controlling transistors or suppressing OFF-current of the switching transistor low. In addition, it is not influenced by the parasitic capacitance of the gate of the first and second current controlling transistors, which will decrease cause of variations and thus enhance the image quality to a great extent.

Also, by operating the driving transistor in a saturation region, its drain current is maintained relatively at a constant value even when the Vds becomes smaller due to the degradation of the light emitting element in place of the voltage Vel increasing, which is applied between the electrodes of the light emitting element. Therefore, a luminance decay is suppressed low even when the light emitting element degrades. Further, since it is not necessary to optimize the manufacturing process of a transistor in order to suppress OFF-current of the transistor for controlling a video signal input to a pixel low, the process can be simplified, leading to the cost reduction and improvement in yield.

BRIEF DESCRIPTION OF THE DRAWINGS

FIGS. 11A to 11E show examples of electronic devices to which the light emitting device of the invention is applied.

DETAILED DESCRIPTION OF THE INVENTION

Embodiment modes and embodiments of the invention will be hereinafter described with reference to the accompanying drawings.

Embodiment Mode 1

Described in this embodiment mode is a pixel of the light emitting device of the invention as an example.

Figure 1:
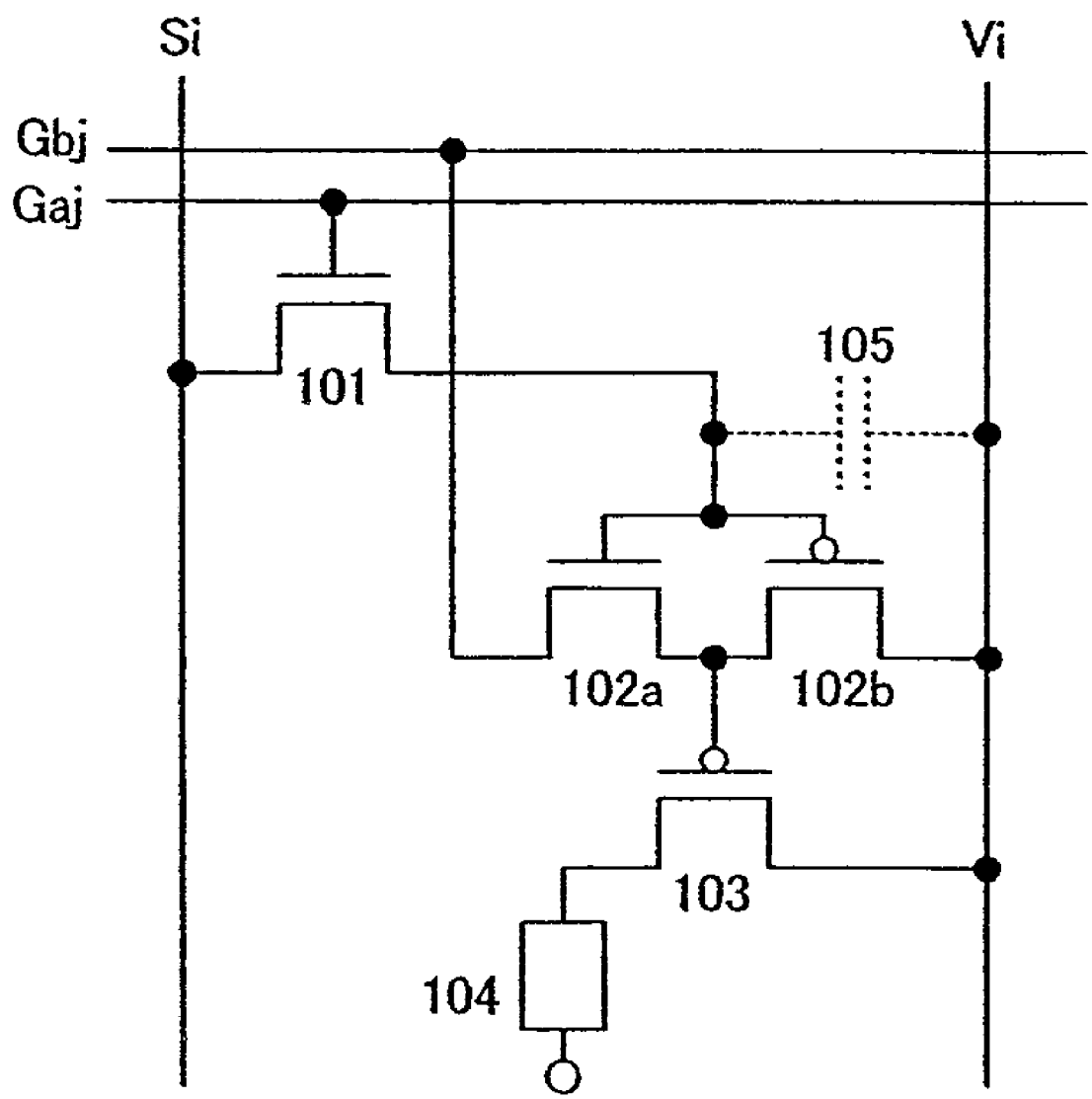
FIG. 1 shows an embodiment mode of a pixel of the light emitting device of the invention.

FIG. 1 shows a circuit diagram of a pixel of this embodiment mode. The pixel includes a switching transistor 101, a first current controlling transistor 102a, a second current controlling transistor 102b, a driving transistor 103, a light emitting element 104, and a capacitor 105. It should be noted that the capacitor 105 is not necessarily disposed in the pixel of the light emitting device according to the invention.

The gate of the switching transistor 101 is connected to a first scan line Gaj (j=1 to y), and either the source or the drain thereof is connected to a signal line Si (i=1 to x) and the other is connected to each gate of the first and second current controlling transistors 102a and 102b. The switching transistor 101 may be either an N-channel transistor or a P-channel transistor.

Either of the first current controlling transistor 102a or the second current controlling transistor 102b is a P-channel transistor and the other is an N-channel transistor. FIG. 1 shows the case in which the first current controlling transistor 102a is an N-channel transistor and the second current controlling transistor 102b is a P-channel transistor. The source of the first current controlling transistor 102a is connected to a second scan line Gbj (j=1 to y) and the source of the second current controlling transistor 102b is connected to a power supply line Vi (i=1 to x) The drains of the first current controlling transistor 102a and the second current controlling transistor 102b are connected to each other and also to the gate of the driving transistor 103.

One of the two electrodes of the capacitor 105 is connected to each gate of the first current controlling transistor 102a and the second current controlling transistor 102b, and the other is connected to the power supply line Vi. The capacitor 105 is disposed so as to store gate voltages of the first current controlling transistor 102a and the second current controlling transistor 102b when the switching transistor 101 is not selected (OFF-state).

The driving transistor 103 is connected to the power supply line Vi and the light emitting element 104 so that its drain current is supplied to the light emitting element 104. In this embodiment mode, the source of the driving transistor 103 is connected to the power supply line Vi and the drain thereof is connected to one of the two electrodes of the light emitting element 104. The driving transistor 103 has the same conductivity as that of the second current controlling transistor 102b. Therefore, the driving transistor 103 is a P-channel transistor as well as the second current controlling transistor 102b.

According to the invention, the driving transistor 103 operates in a saturation region while the switching transistor 101, the first current controlling transistor 102a and the second current controlling transistor 102b operate in a linear region. Also, L (channel length) of the driving transistor 103 is longer than its W (channel width), and more preferably, the ratio of the L to W of the driving transistor 103 is five or more. According to the foregoing structure, variations in luminance of the light emitting elements 104 among pixels due to variations in characteristics of the driving transistors 103 can be suppressed. Further, it is desirable that the first current controlling transistor 102a and the second current controlling transistor 102b are each designed to have L equal to or shorter than W thereof.

The light emitting element 104 includes an anode, a cathode, and a light emitting layer sandwiched between them. When the driving transistor 103 is a P-channel transistor, it is preferable that the anode of the light emitting element 104 is connected to the drain of the driving transistor 103. On the other hand, when the driving transistor 103 is an N-channel transistor, it is preferable that the cathode of the light emitting element 104 is connected to the drain of the driving transistor 103. In either case, either one of the electrodes which is connected to the drain of the driving transistor 103 corresponds to a pixel electrode and the other electrode corresponds to a counter electrode.

Each of the power supply line Vi and the counter electrode of the light emitting element 104 is supplied with a different fixed potential. These two potentials are set to have levels so that current flows into the light emitting element 104 in the forward bias direction when the driving transistor 103 is ON.

A driving method of the pixel shown in FIG. 1 is described now. The operation of the pixel shown in FIG. 1 can be divided into a write period, a data storage period, and an erase period.

Figure 2A:
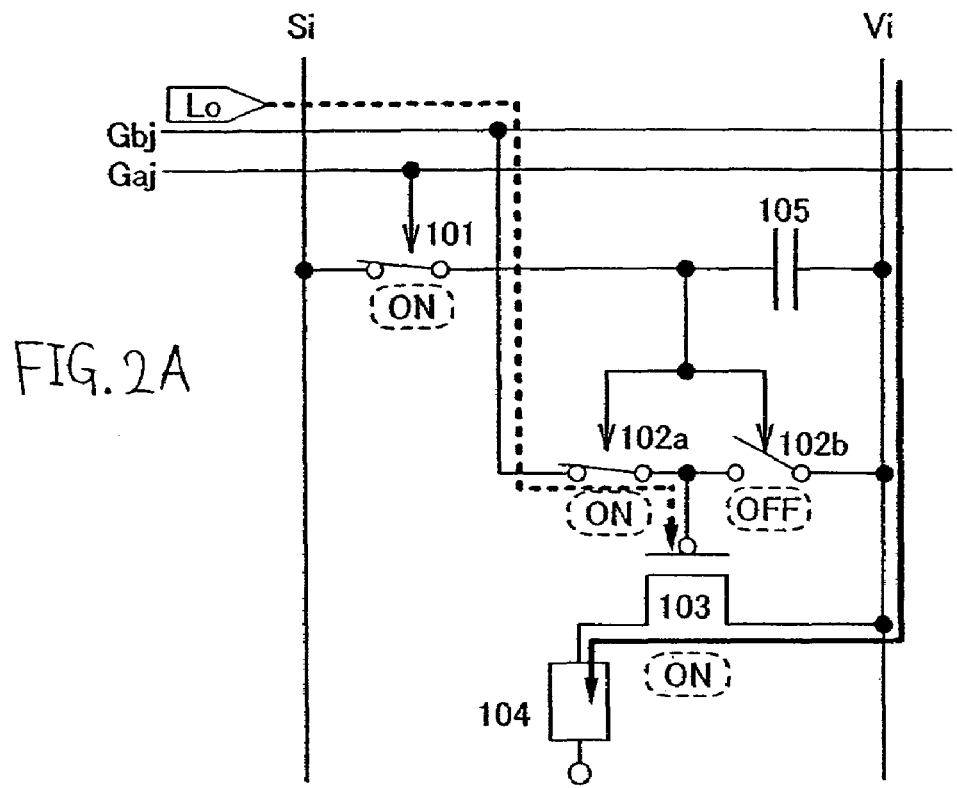
FIGS. 2A and 2B show pattern diagrams each showing an operation of the pixel shown in FIG. 1.

FIG. 2A schematically shows an operation of the pixel in the case where the light emitting element 104 emits light in the write period. As shown in FIG. 2A, when the first scan line Gaj (j=1 to y) is selected in the write period, the switching transistor 101 whose gate is connected to the first scan line Gaj (j=1 to y) is turned ON. Then, a video signal which has been input to the signal line Si (i=1 to x) is input to each gate of the first current controlling transistor 102a and the second current controlling transistor 102b through the switching transistor 101.

In the case of FIG. 2A, the first current controlling transistor 102a is turned ON while the second current controlling transistor 102b is turned OFF by a video signal. Through the first current controlling transistor 102a which is turned ON, a potential of the second scan line Gbj (j=1 to y) is supplied to the gate of the driving transistor 103. The second scan line Gbj in the write period is supplied with a potential (first potential) which has high level enough to turn ON the driving transistor 103. Specifically in this embodiment mode, the driving transistor 103 is, as it is a P-channel transistor, supplied with the first potential (denoted by Lo) which is lower than the sum of the threshold voltage and the potential (third potential) of the power supply line Vi so that the gate voltage Vgs thereof becomes lower than the threshold voltage. When the driving transistor 103 is turned ON, a drain current of the driving transistor 103 is supplied to the light emitting element 104, thus it emits light.

Figure 2B:
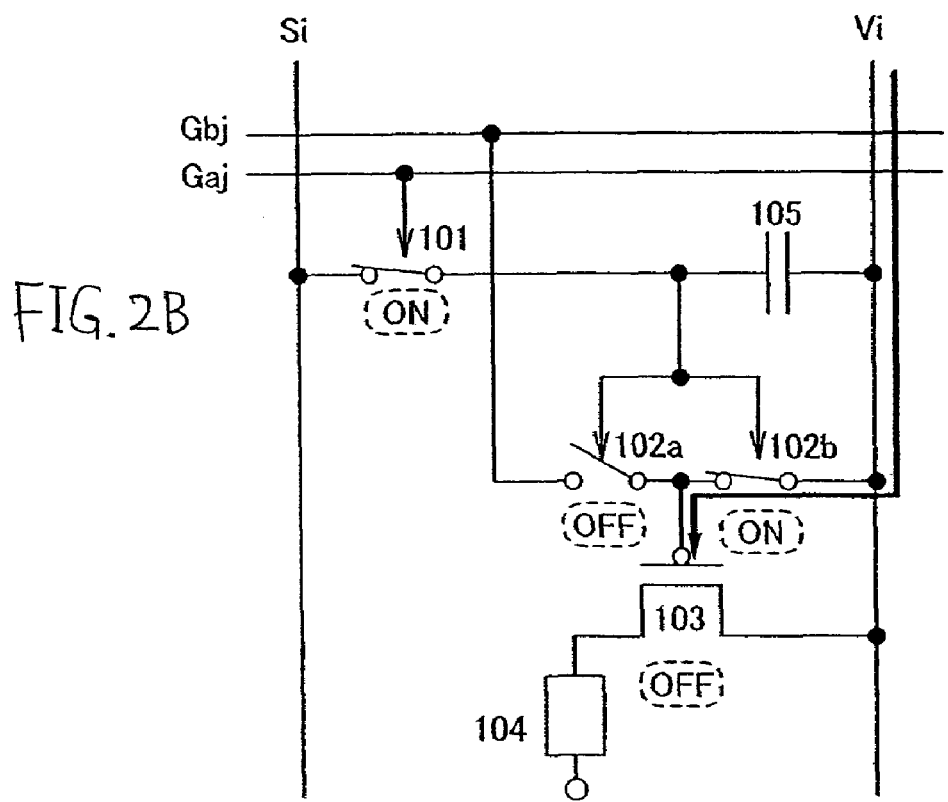

FIG. 2B schematically shows an operation of the pixel in the case where the light emitting element 104 emits no light in the write period. As in FIG. 2A, when the first scan line Gaj (j=1 to y) is selected in the write period, the switching transistor 101 whose gate is connected to the first scan line Gaj (j=1 to y) is turned ON. Then, a video signal which has been input to the signal line Si (i=1 to x) is input to each gate of the first current controlling transistor 102a and the second current controlling transistor 102b through the switching transistor 101.

In the case of FIG. 2B, the first current controlling transistor 102a is turned OFF while the second current controlling transistor 102b is turned ON by a video signal. Through the second current controlling transistor 102a which is ON, the potential (third potential) of the power supply line Vi (i=1 to x) is supplied to the gate of the driving transistor 103. Then, the driving transistor 103 is turned OFF since the source and the gate thereof are electrically connected to each other, which means no drain current thereof is supplied to the light emitting element 104, thus it emits no light.

An operation of the pixel in the data storage period is described now. In the data storage period, the first scan line Gaj is not selected and the switching transistor 101 is thus turned OFF. The potential supply to the second scan line Gbj is kept on from the write period through this period. Also, the switching of each of the first current controlling transistor 102a and the second current controlling transistor 102b is maintained according to the video signal which has been input in the write period.

Figure 3A:
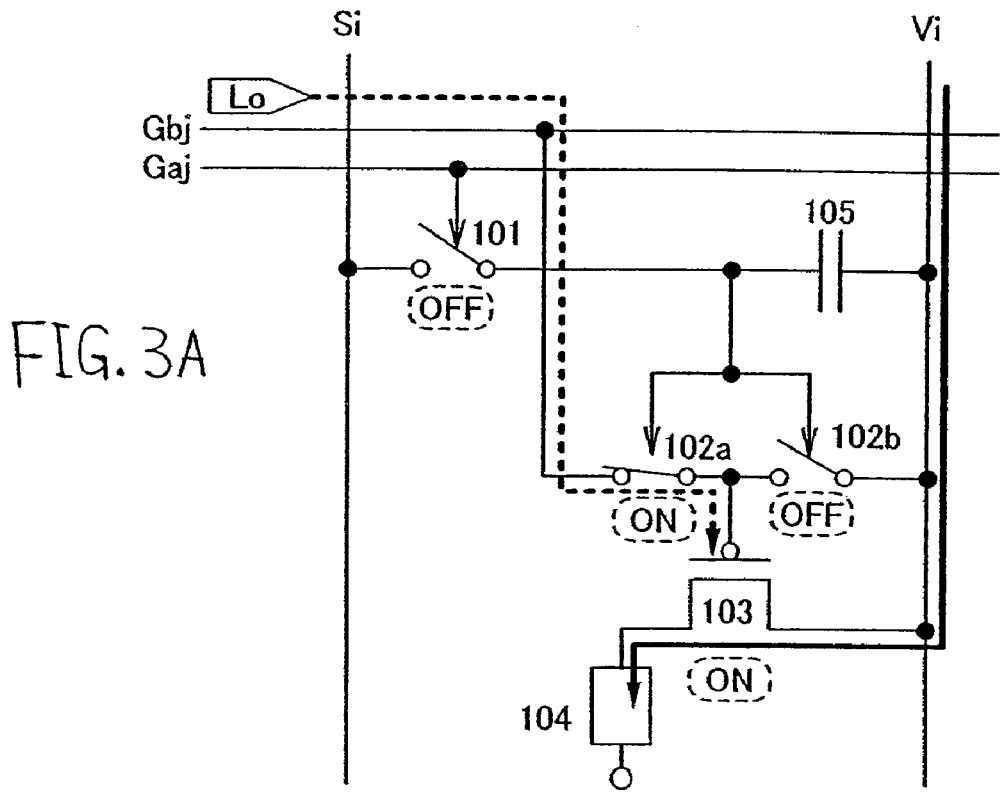
FIGS. 3A and 3B show pattern diagrams each showing an operation of the pixel shown in FIG. 1.

FIG. 3A schematically shows an operation of the pixel in the data storage period in the case where the operation shown in FIG. 2A is performed in the write period. Specifically, when the first current controlling transistor 102a is ON while the second current controlling transistor 102b is OFF as shown in FIG. 2A, the operation is kept on through the data storage period, thus the light emitting element 104 keeps on emitting light. Meanwhile, though not shown, when the first current controlling transistor 102a is OFF while the second current controlling transistor 102b is ON as shown in FIG. 2B, the operation is kept on through the data storage period, thus the light emitting element 104 keeps on emitting no light.

Figure 3B:
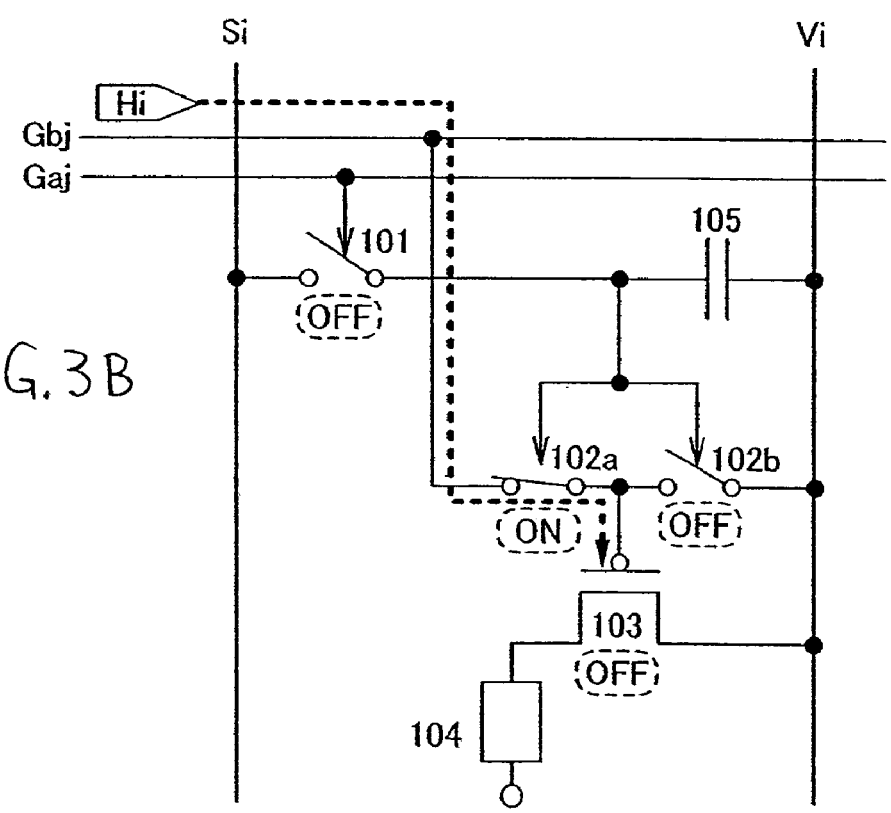

The operation of the pixel in the erase period is described now. In the erase period, the light emitting elements 104 in all the pixels are forced to emit no light regardless of whether or not the light emitting element 104 has been emitting light in the data storage period. FIG. 3B schematically shows an operation in the case where an erase period is provided to force the light emitting element 104 to emit no light after the data storage period in which it emits light as shown in FIG. 3A.

In the erase period, the switching transistor 101 is held OFF, and the potential supplied to the second scan line Gbj changes from the first potential to a second potential which has high level enough to turn OFF the driving transistor 103. Specifically in this embodiment mode, the potential changes to the second potential (denoted by Hi) which is higher than the sum of the threshold voltage and the potential of the power supply line Vi (third potential) since the driving transistor 103 is a P-channel transistor. Since the switching transistor 101 is OFF at this time, each gate of the first current controlling transistor 102a and the second current controlling transistor 102b is in a floating state. When the potential supplied to the source of the first current controlling transistor 102a changes from the first potential to the second potential, the gate potential thereof becomes higher ideally by the potential difference between the first potential and the second potential since the first current controlling transistor 102a has the gate-source capacitance. Therefore, even when the potential supplied to the source of the first current controlling transistor 102a changes from the first potential to the second potential, the first current controlling transistor 102a which is an N-channel transistor is turned ON and the second current controlling transistor which is a P-channel transistor is turned OFF. Thus, the second potential of the second scan line Gbj is supplied to the gate of the driving transistor 103 through the first current controlling transistor 102a.

Meanwhile, when providing the erase period after the first current controlling transistor 102a is turned OFF while the second current controlling transistor 102b is turned ON in the write period and also after the data storage period, the source potential of the first current controlling transistor 102a corresponds to the second potential, and the source potential of the second current controlling transistor 102b corresponds to the potential (third potential) of the power supply line Vi. Therefore, in either case in which the first current controlling transistor 102a is ON or the second current controlling transistor 102b is ON, the gate of the driving transistor 103 is held OFF, thus the light emitting element 104 keeps on emitting no light in the erase period.

As set forth above, the light emitting element 104 keeps on emitting no light regardless of a video signal in the erase period, while in the total period (hereinafter referred to as a display period) of the write period and the data storage period, the emission or the non-emission of the light emitting element 104 is selected according to a video signal. The gray scale display can be performed by selecting emission periods among all the display periods within one frame by a video signal, thereby controlling the total emission period of the light emitting element 104.

Therefore, it is possible to prevent current supplied to the light emitting element 104 from varying easily without increasing the storage capacity of the capacitor 105 which is disposed between each gate and source of the first current controlling transistor 102a and the second current controlling transistor 102b or optimizing a manufacturing process of a transistor so as to suppress OFF-current of the switching transistor 101. Further, the current supplied to the light emitting element 104 is not influenced by the parasitic capacitance of each gate of the first current controlling transistor 102a and the second current controlling transistor 102b. Thus, cause of variations is reduced and the image quality is thus enhanced to a great extent.

Also, by operating the driving transistor 103 in a saturation region, its drain current is maintained relatively at a constant value even when Vgs becomes smaller due to the degradation of the light emitting element 104 in place of the voltage Vel increasing, which is applied between the electrodes of the light emitting element 104. Therefore, a luminance decay is suppressed low even when the light emitting element 104 degrades. Further, since it is not necessary to optimize the manufacturing process of a transistor in order to suppress OFF-current of the transistor for controlling a video signal input to a pixel low, the process can be simplified, leading to the cost reduction and improvement in yield.

Figure 4:
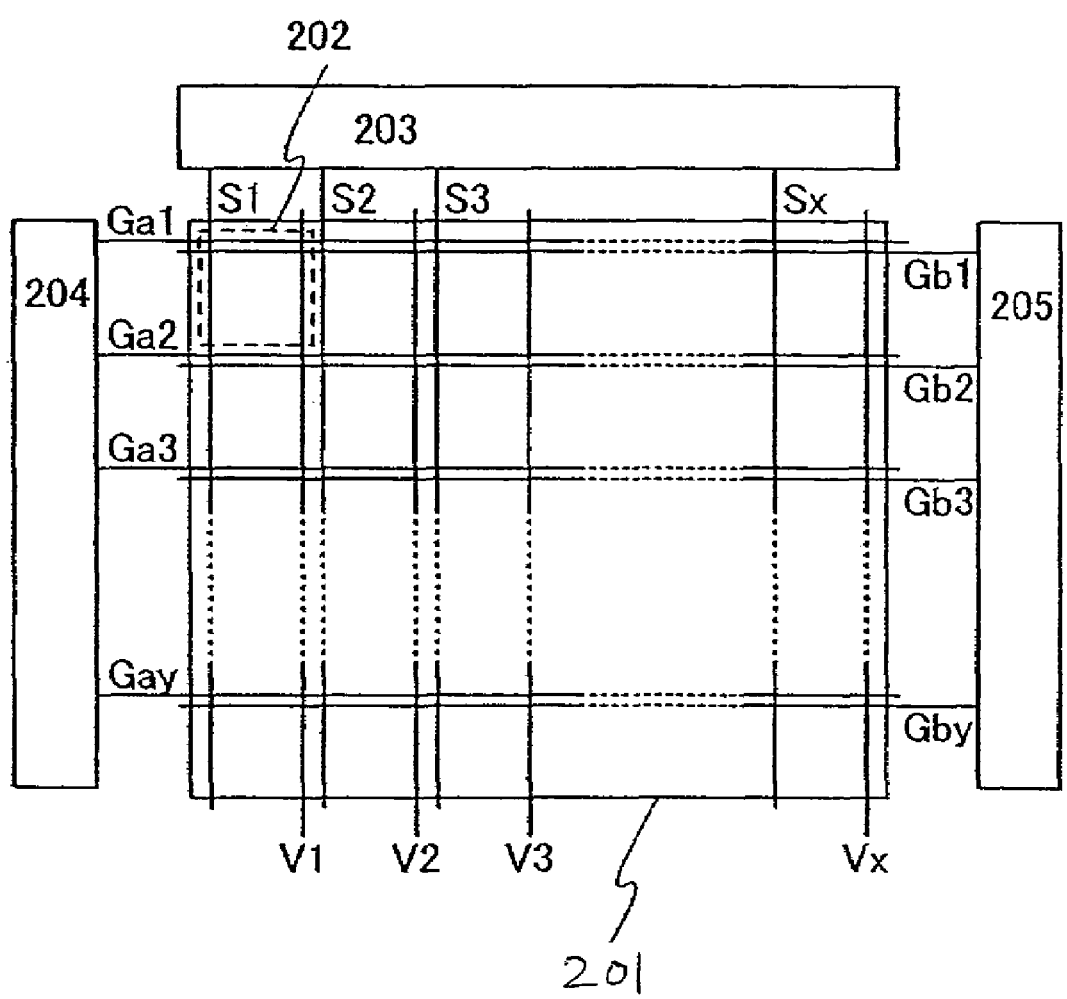
FIG. 4 shows a block diagram of the light emitting device of the invention.
Figure 5:
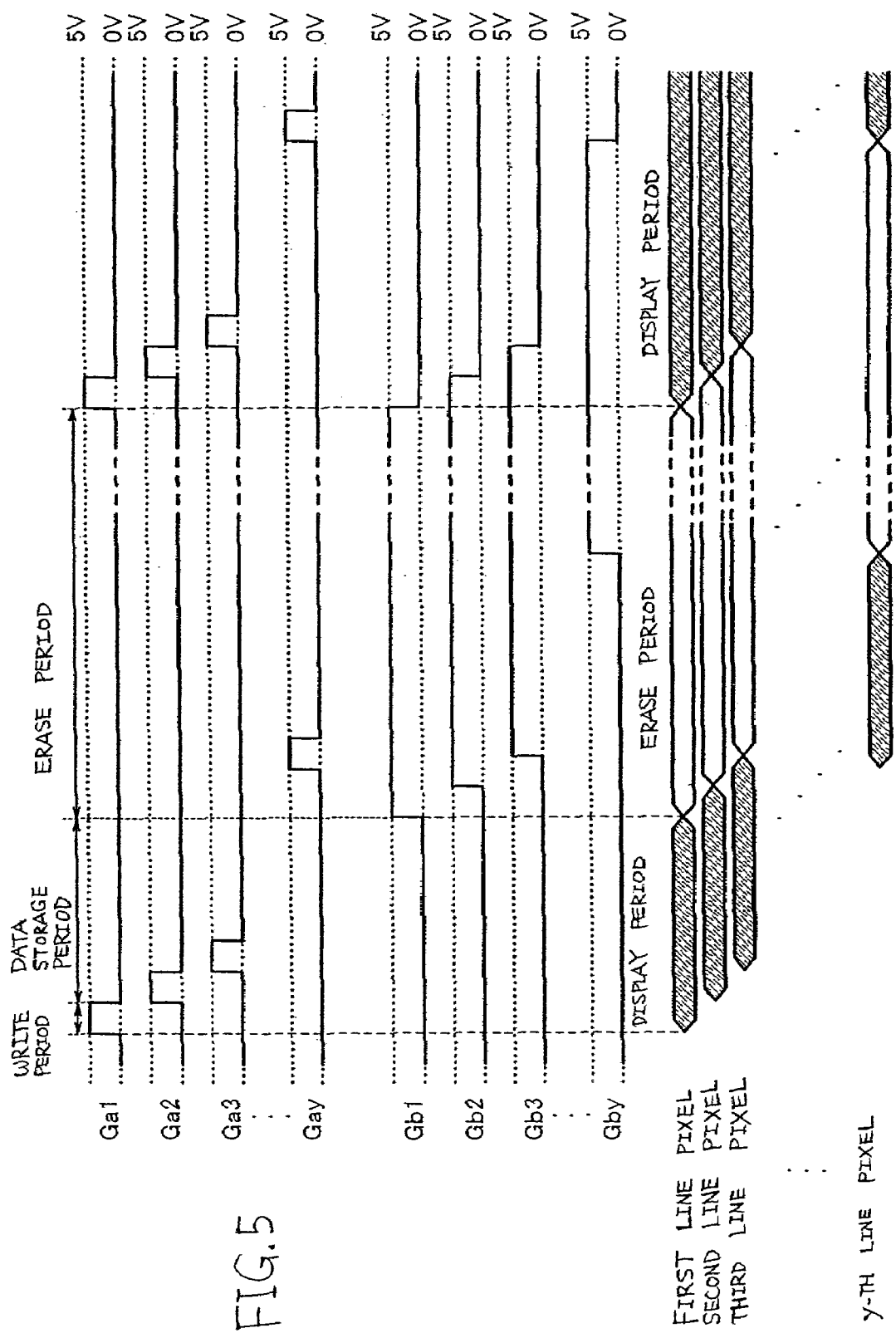
FIG. 5 shows a timing chart of a potential which is supplied to first and second scan lines, which shows a timing of a display period and an erase period.

FIG. 4 shows a block diagram of the light emitting device of the invention. FIG. 5 shows a timing chart of the first and second scan lines provided in the pixel portion of the light emitting device shown in FIG. 4, which shows a timing of a display period and an erase period.

The light emitting device shown in FIG. 4 includes a pixel portion 201 in which pixels 202 are arranged in matrix, a signal driver circuit 203 for controlling a video signal input to signal lines S1 to Sx, a first scan driver circuit 204 for controlling a potential level which is supplied to first scan lines Ga1 to Gay, and a second scan driver circuit 205 for controlling a potential level which is supplied to second scan lines Gb1 to Gby. Also, power supply lines V1 to Vx are provided in the pixel portion 201, and the pixel 202 has the configuration as shown in FIG. 1.

As shown in FIG. 5, the display period including the write period and the data storage period, and the erase period appear at the different timing among each pixel having the first scan line and the second scan line in common. Although the first potential and the second potential which are supplied to the second scan lines Gb1 to Gby are 0 V and 5 V respectively in FIG. 5, the invention is not limited to this.

It should be noted that the erase period does not necessarily start immediately after the display period, and another display period may appear in sequence. In this case, the write period comes once again after the data storage period. By providing the erase period, it becomes possible to terminate the data storage period in the pixels of a line in which the write period has appeared first before the write period appears in the pixels of all lines, thereby performing a high-level gray scale display while suppressing an operation frequency of the signal driver circuit.

Embodiment Mode 2

Described in this embodiment mode is a pixel configuration and is operation of a pixel based on FIG. 1, in which the first current controlling transistor, the second current controlling transistor, and the driving transistor have the opposite conductivity to those in FIG. 1.

Figure 6:
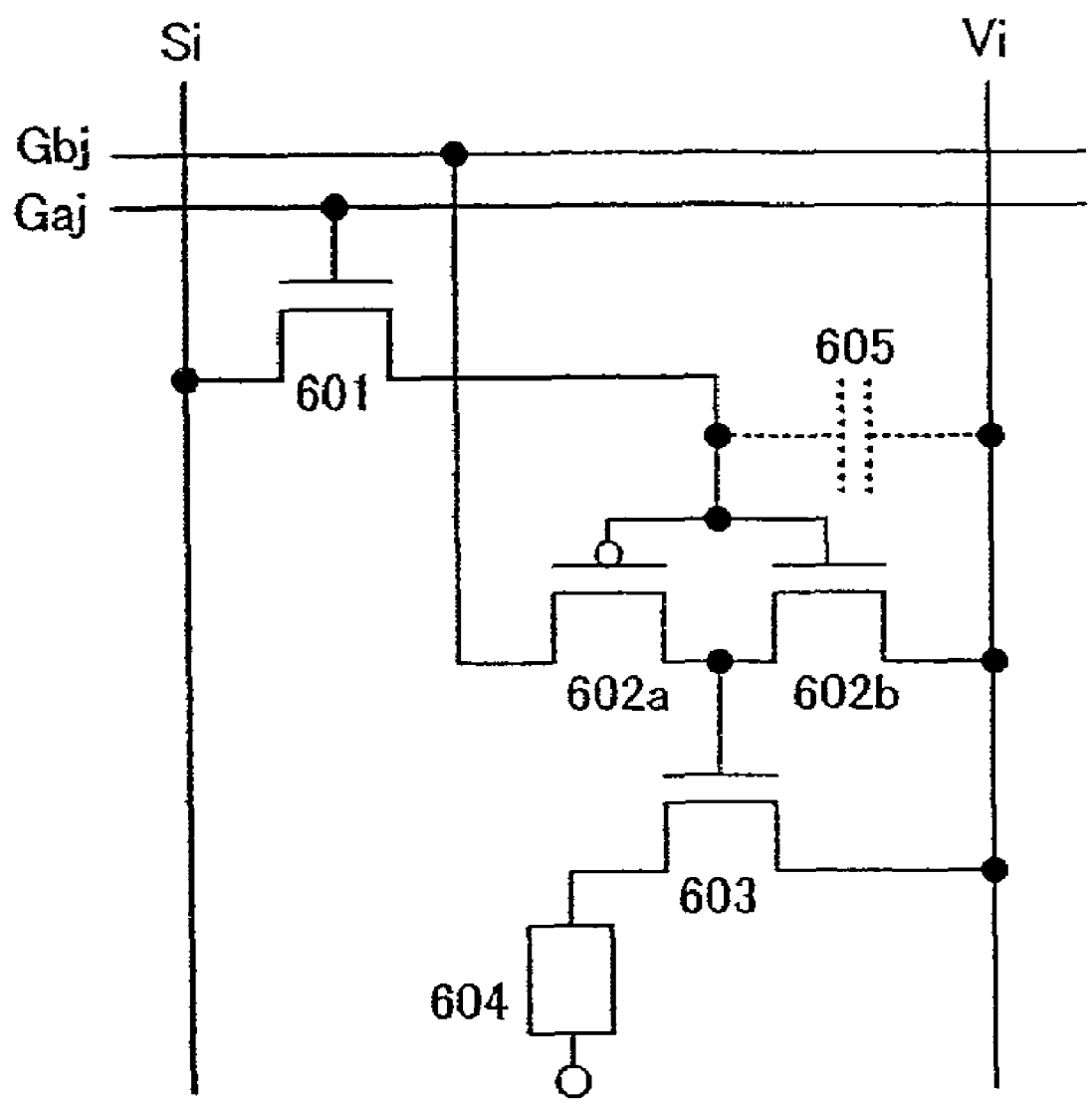
FIG. 6 shows an embodiment mode of a pixel of the light emitting device of the invention.

FIG. 6 shows a circuit diagram of a pixel of this embodiment mode. The pixel includes a switching transistor 601, a first current controlling transistor 602a, a second current controlling transistor 602b, a driving transistor 603, a light emitting element 604, and a capacitor 605. It should be noted that the capacitor 605 is not necessarily disposed in the pixel of the light emitting device according to the invention. The connection between each element shown in FIG. 6 is the same as in FIG. 1, however, the first current controlling transistor 602a, the second current controlling transistor 602b, and the driving transistor 603 have the opposite conductivity to those in FIG. 1. That is, the first current controlling transistor 602a is a P-channel transistor, the second current controlling transistor 602b is an N-channel transistor, and the driving transistor 603 is an N-channel transistor. In this embodiment mode, a cathode of the two electrodes of the light emitting element 604 is connected to the drain of the driving transistor 603.

Each of the power supply line Vi and the counter electrode of the light emitting element 604 is supplied with a different fixed potential. These two potentials are set to have levels so that current flows into the light emitting element 604 in the forward bias direction when the driving transistor 603 is ON.

The operation of the pixel shown in FIG. 6 can be divided into a write period, a data storage period, and an erase period.

However, as the driving transistor 603 is an N-channel transistor, the first potential supplied to the second scan line Gbj (j=1 to y) is set higher than the sum of threshold voltage and the potential (third potential) of the power supply line Vi (i=1 to x) so that the gate voltage Vgs of the driving transistor 603 becomes higher than the threshold voltage.

In the erase period, the second potential supplied to the second scan line Gbj is set lower than the sum of the threshold voltage and the potential (third potential) of the power supply line Vi so that the gate voltage Vgs of the driving transistor 603 becomes lower than the threshold voltage. Meanwhile, when the second current controlling transistor 602b which is an N-channel transistor has been OFF since the write period, it is held OFF even when its gate potential becomes lower. On the other hand, when the second current controlling transistor 602b has been ON since the write period, it is turned OFF when its gate potential becomes lower or held ON depending on the threshold voltage. However, in either case of the second current controlling transistor 602b being OFF or ON, the driving transistor 603 is held OFF, thus the light emitting element 604 keeps on emitting no light in the erase period.

Embodiment 1

A transistor used in the invention may be a transistor formed by using amorphous silicon. In that case, a manufacturing process can be simplified as a crystallization process is dispensed with, leading to the cost reduction. The transistor formed by using amorphous silicon preferably has N-type conductivity than P-type as it has higher mobility and thus be suitably applied to a pixel of a light emitting device. Described in this embodiment is a cross-sectional structure of a pixel in which a driving transistor is an N-channel transistor.

Figure 7A:
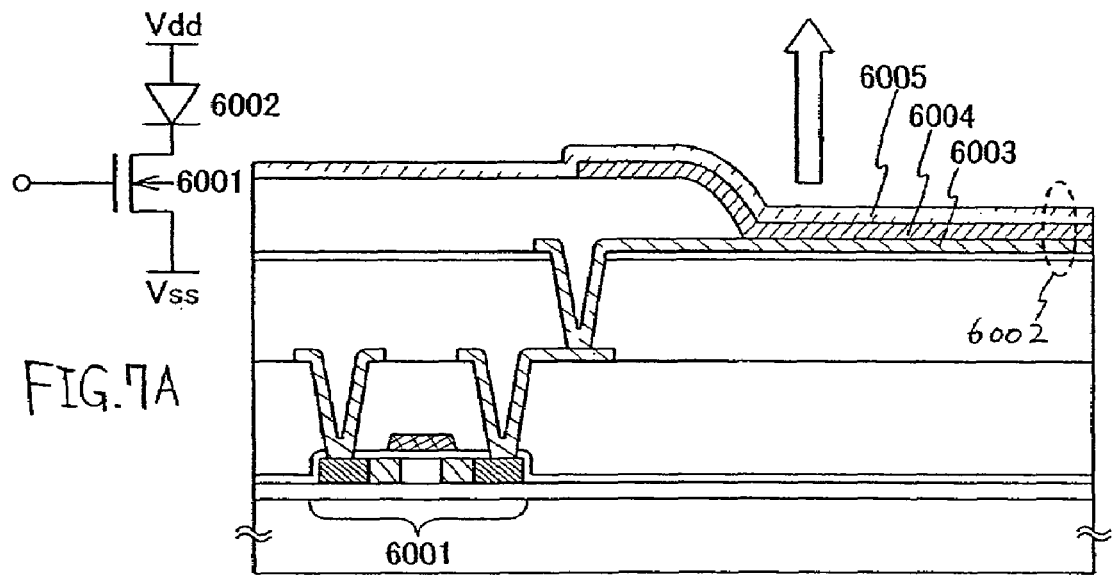
FIGS. 7A and 7B show cross-sectional diagrams of a pixel of the invention.

FIG. 7A shows a cross-sectional view of a pixel including an N-channel driving transistor 6001 and a light emitting element 6002 from which light is emitted to an anode 6005 side. In FIG. 7A, a cathode 6003 of the light emitting element 6002 is electrically connected to the drain of the driving transistor 6001, and a light emitting layer 6004 and the anode 6005 are laminated in this order on the cathode 6003. The cathode 6003 may be formed by using a known material as long as it is a light-reflective conductive film having a low work function. For example, Ca, Al, CaF, MgAg, AlLi, and the like are desirably used. The light emitting layer 6004 may include a single layer or multiple layers. When including multiple layers, an electron injection layer, an electron transporting layer, a light emitting layer, a hole transporting layer, and a hole injection layer are laminated in this order on the cathode 6003. It should be noted that not all of these layers are necessarily provided. The anode 6005 may be formed of a transparent conductive film which transmits light such as the one comprising ITO or the one in which indium oxide is mixed with 2 to 20% of zinc oxide (ZnO).

The overlapped portion of the cathode 6003, the light emitting layer 6004, and the anode 6005 corresponds to the light emitting element 6002. In the case of the pixel shown in FIG. 7A, light emitted from the light emitting element 6002 is transmitted to the anode 6005 side as shown by an outline arrow.

Figure 7B:
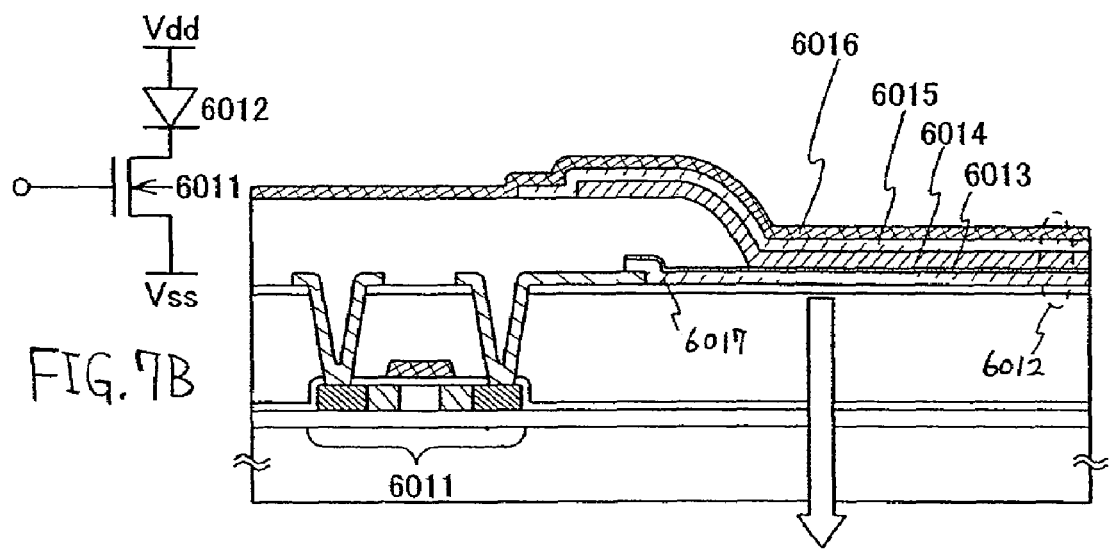

FIG. 7B shows a cross-sectional view of a pixel including an N-channel driving transistor 6011 and a light emitting element 6012 from which light is emitted to a cathode 6013 side. In FIG. 7B, the cathode 6013 of the light emitting element 6012 is formed on a transparent conductive film 6017 which is electrically connected to the drain of the driving transistor 6011, and a light emitting layer 6014 and an anode 6015 are laminated in this order on the cathode 6013. A shielding film 6016 which reflects or shuts off light is formed so as to cover the anode 6015. As for the cathode 6013, a known material can be used as in FIG. 7A as long as it is a conductive film having a low work function, and the film is formed thin enough to transmit light. For example, Al having a thickness of 20 nm can be used for the cathode 6013. The light emitting layer 6014 may include a single layer or multiple layers. The anode 6015 may be formed of a transparent conductive film as in FIG. 7A although it is not required to transmit light. For the shielding film 6016, a light-reflective metal can be used for example, however, the invention is not limited to a metal film. For example, a resin doped with black pigment and the like can be used.

The overlapped portion of the cathode 6013, the light emitting layer 6014, and the anode 6015 corresponds to the light emitting element 6012. In the case of the pixel shown in FIG.

7B, light emitted from the light emitting element 6012 is transmitted to the cathode 6013 side as shown by an outline arrow.

Embodiment 2

Described in this embodiment is a cross-sectional structure of a pixel in which a driving transistor is a P-channel transistor.

Figure 8A:
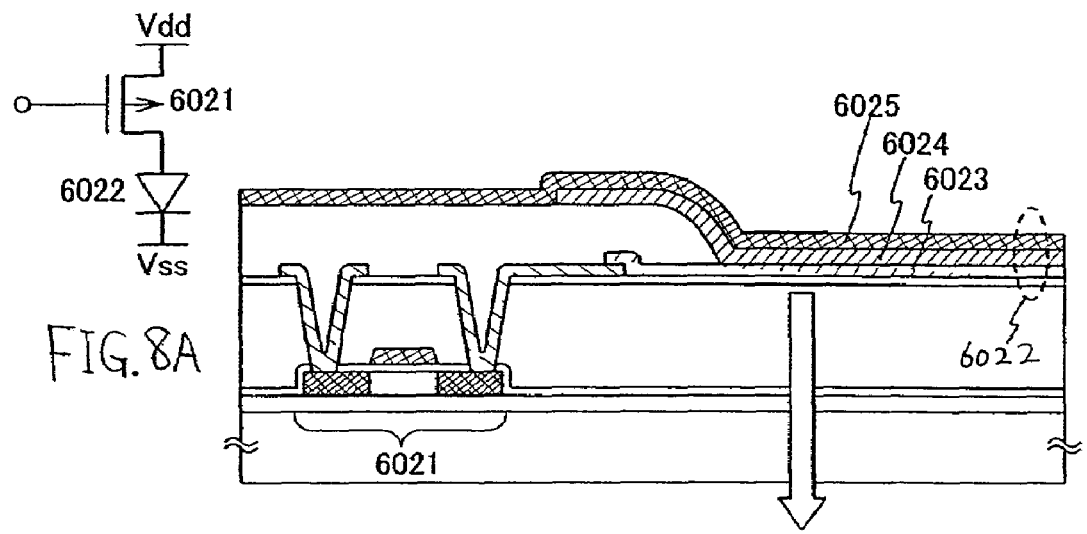
FIGS. 8A and 8B show cross-sectional diagrams of a pixel of the invention.

FIG. 8A shows a cross-sectional view of a pixel including a P-channel driving transistor 6021 and a light emitting element 6022 from which light is emitted to an anode 6023 side. In FIG. 8A, the anode 6023 of the light emitting element 6022 is electrically connected to the drain of the driving transistor 6021, and a light emitting layer 6024 and a cathode 6025 are laminated in this order on the anode 6023. The cathode 6025 may be formed by using a known material as long as it is a light-reflective conductive film having a low work function. For example, Ca, Al, CaF, MgAg, AlLi, and the like are desirably used. The light emitting layer 6024 may include a single layer or multiple layers. When including multiple layers, a hole injection layer, a hole transporting layer, a light emitting layer, an electron transporting layer, and an electron injection layer are sequentially laminated in this order on the a node 6023. It should be noted that not all of these layers are necessarily provided. The anode 6023 may be formed of a transparent conductive film which transmits light such as the one comprising ITO or the one in which indium oxide is mixed with 2 to 20% of zinc oxide (ZnO).

The overlapped portion of the anode 6023, the light emitting layer 6024, and the cathode 6025 corresponds to the light emitting element 6022. In the case of the pixel shown in FIG. 8A, light emitted from the light emitting element 6022 is transmitted to the anode 6023 side as shown by an outline arrow.

Figure 8B:
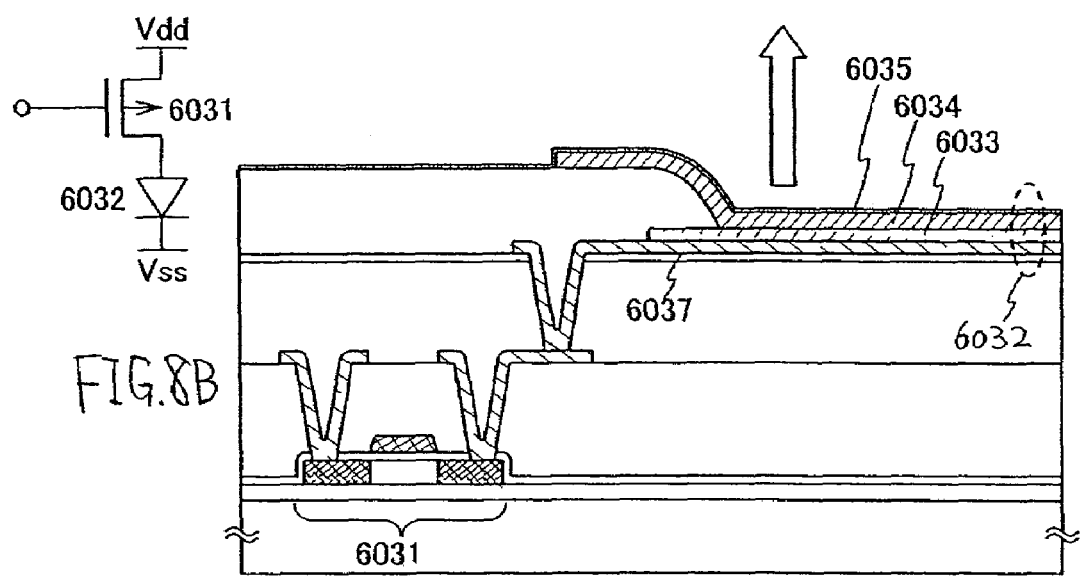

FIG. 8B shows a cross-sectional view of a pixel in which a driving transistor 6031 is a P-channel transistor and light emitted from a light emitting element 6032 is transmitted to a cathode 6035 side. In FIG. 8B, an anode 6033, a light emitting layer 6034, and the cathode 6035 of the light emitting element 6032 are laminated in this order on a wiring 6037 which is electrically connected to the drain of the driving transistor 6031. According to the aforementioned structure, light is reflected in the wiring 6037 even if the light is transmitted through the anode 6033. As for the cathode 6035, a known material can be used as in FIG. 8A as long as it is a conductive film having a low work function, and the film is formed thin enough to transmit light. For example, Al having a thickness of 20 nm can be used for the cathode 6035. The light emitting layer 6034 may include a single layer or multiple layers as in FIG. 8A. Although the anode 6033 is not required to transmit light, it can be formed by using a transparent conductive film as in FIG. 8A.

The overlapped portion of the anode 6033, the light emitting layer 6034, and the cathode 6035 corresponds to the light emitting element 6032. In the case of the pixel shown in FIG. 8B, light emitted from the light emitting element 6032 is transmitted to the cathode 6035 side as shown by an outline arrow.

Embodiment 3

Figure 9:
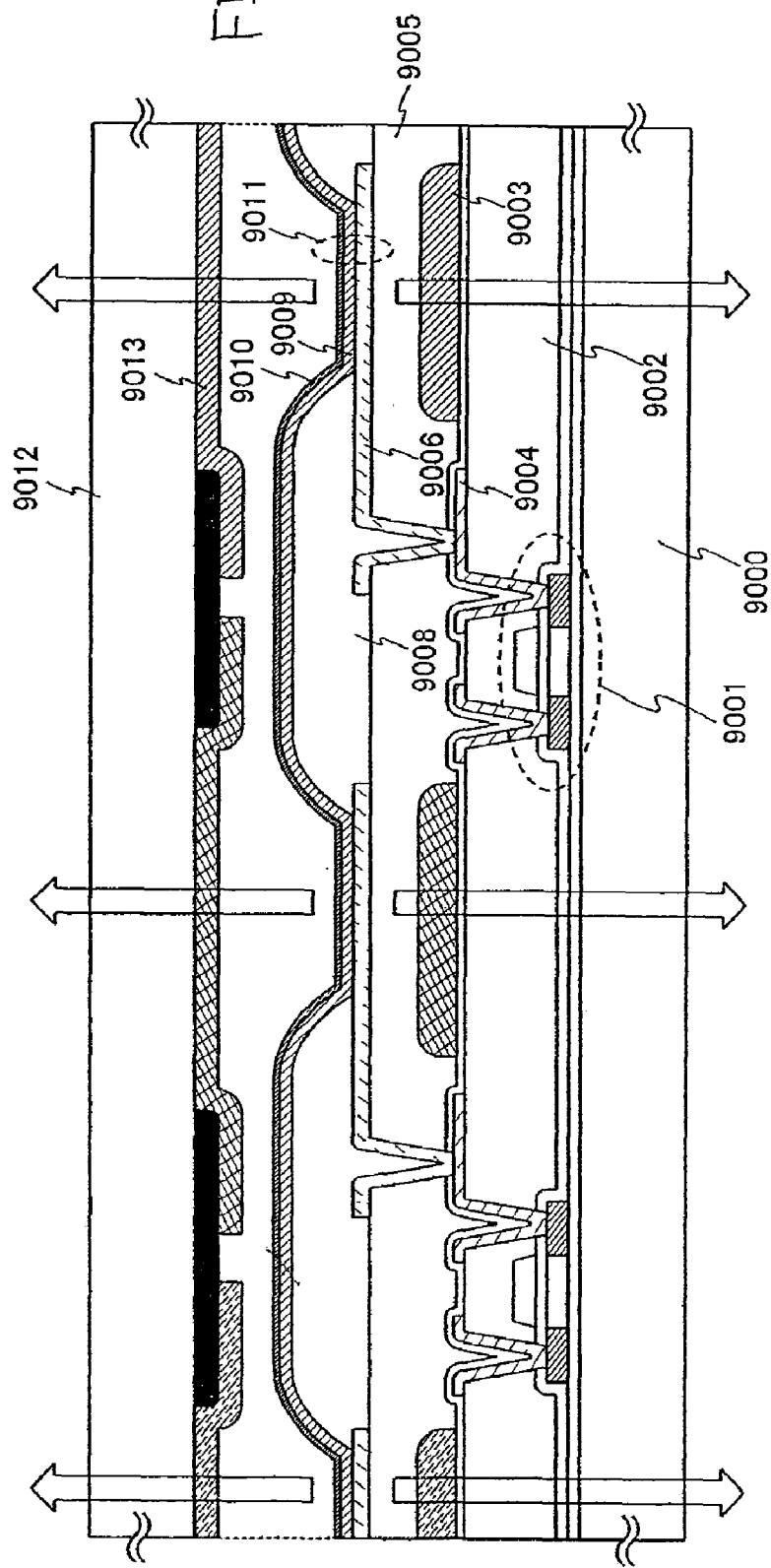
FIG. 9 shows a cross-sectional diagram of a pixel of the invention.

Referring now to FIG. 9, a cross-sectional structure of a pixel of the light emitting device according to the invention is described. FIG. 9 shows a driving transistor 9001 formed on a substrate 9000. The driving transistor 9001 is covered with a first interlayer insulating film 9002. On the first interlayer insulating film 9002, a color filter 9003 formed of a resin and the like is formed, and a wiring 9004 which is electrically connected to the drain of the driving transistor 9001 through a contact hole is formed thereon.

A second interlayer insulating film 9005 is formed on the first interlayer insulating film 9002 so as to cover the color filter 9003 and the wiring 9004. Each of the first interlayer insulating film 9002 and the second interlayer insulating film 9005 may be formed by depositing silicon oxide, silicon nitride, or silicon oxynitride in a single layer or laminated layers by plasma CVD or sputtering. It is also possible to use a silicon oxynitride film in which a mole fraction of oxygen is higher than that of nitrogen is laminated over a silicon oxynitride film in which a mole fraction of nitrogen is higher than that of oxygen as the first interlayer insulating film 9002 or the second interlayer insulating film 9005. Alternatively, an organic resin film may be used as the first interlayer insulating film 9002 or the second interlayer insulating film 9005.

On the second interlayer insulating film 9005, a wiring 9006 which is electrically connected to the wiring 9004 through a contact hole is formed. A part of the wiring 9006 functions as an anode of a light emitting element. The wiring 9006 is formed so as to overlap with the color filter 9003 with the second interlayer insulating film 9005 interposed therebetween.

In addition, an organic resin film 9008 is formed over the second interlayer insulating film 9005 so as to function as a bank. The organic resin film 9008 has an opening, and a light emitting element 9011 is formed by overlapping the wiring 9006 which functions as an anode, a light emitting layer 9009, and a cathode 9010 through the opening. The light emitting layer 9009 has a single light emitting layer or multiple layers including a light emitting layer. It is also possible to form a protective film over the organic resin film 9008 and the cathode 9010. In this case, the protective film is formed of a film that allows substances that may cause the deterioration of the light emitting element such as moisture and oxygen to penetrate with difficulty in comparison with other insulating films is used. Typically, a DLC film, a carbon nitride film, a silicon nitride film formed by RF sputtering, or the like is preferably used. Also, it is also possible to form a protective film by laminating the aforementioned film that allows substances such as moisture and oxygen to penetrate with difficulty and a film that allows substances such as moisture and oxygen to penetrate easier in comparison with the former film.

Before the light emitting layer 9009 is formed, the organic resin film 9008 is heated in a vacuum atmosphere in order to remove adsorbed moisture, oxygen, and the like. Specifically, heat treatment is applied in a vacuum atmosphere at a temperature of 100 to 200° C. for about 0.5 to 1 hour. The vacuum is desirably set at $3\times10^{-7}$ Torr or less, and, if possible, most desirably at $3\times10^{-8}$ Torr or less. In the case of depositing a light emitting layer after applying heat treatment onto an organic resin film in the vacuum atmosphere, the reliability can be further enhanced by maintaining the light emitting layer in the vacuum atmosphere until immediately before the deposition.

As for an end portion of the opening of the organic resin film 9008, it is desirable to be formed roundish so that the light emitting layer 9009 to be formed later so as to partially overlap with the organic resin film 9008 will have no holes in the end. Specifically, a curvature radius of the curved line of the opening shown by the sectional surface of the organic resin film 9008 is desirably in the range of 0.2 to 2 μm.

According to the aforementioned structure, the coverage of a light emitting layer and a cathode that are formed later can be enhanced. Thus, it can be prevented that the wiring 9006 and the cathode 9010 are short-circuited in the holes that are formed in the light emitting layer 9009. Moreover, by alleviating the stress of the light emitting layer 9009, a defect called shrink, in which a light emitting region decreases, can be reduced and the reliability is thus enhanced.

In the example shown in FIG. 9, a positive photosensitive acrylic resin is used as the organic resin film 9008. Photosensitive organic resin is classified into a positive type in which a portion of a resin film that is exposed to an energy beam such as photon, electron, and ion is removed, and a negative type in which the exposed portion remains whereas the rest is removed. In the invention, a negative organic resin film may also be used. In addition, the organic resin film 9008 may also be formed by using photosensitive polyimide. When the organic resin film 9008 is formed by using negative photosensitive acrylic, an end portion of the opening of the organic resin film 9008 takes on an S-shaped cross section. It is desirable that curvature radius of the curved line of an upper end portion and a lower end portion of the opening be from 0.2 to 2 μm.

For the wiring 9006, a transparent conductive film provided by mixing 2 to 20% of zinc oxide (ZnO) with indium oxide may be used as well as ITO. FIG. 9 employs ITO as the wiring 9006. The wiring 9006 may be wiped and polished by CMP and by using a PVA (polyvinyl alcohol) porous body to level off the surface. Also, after polishing the surface of the wiring 9006 by CMP, it may be subjected to ultraviolet irradiation, oxygen plasma treatment, or the like.

The cathode 9010 is formed thin enough to transmit light. Any known material can be used for the cathode 9010 as long as being a conductive film having a low work function. For example, Ca, Al, CaF, MgAg, AlLi and the like are preferably used. In order to obtain light emitted from the cathode side, a method of employing ITO doped with Li and thus having lower work function may be used as well as the method of reducing the film thickness. The light emitting element according to the invention may have a structure in which light is emitted from both anode and cathode sides.

Practically, when the device has been completed up to the stage shown in FIG. 9, a light-transmissive covering material 9012 or a protective film (a laminate film, an ultraviolet curable resin film, or the like) having good airtightness and less degasification is desirably used to package (seal) the device without exposing it to the air. At that time, the reliability of the light emitting element is enhanced by filling the inside of the covering material with an inert atmosphere or providing a moisture absorbent material (e.g., barium oxide). According to the invention, the covering material 9012 may be provided with a color filter 7013.

It should be noted that the invention is not limited to the manufacturing method as described above, and alternative known methods can be used as well.

Embodiment 4

Figure 10A:
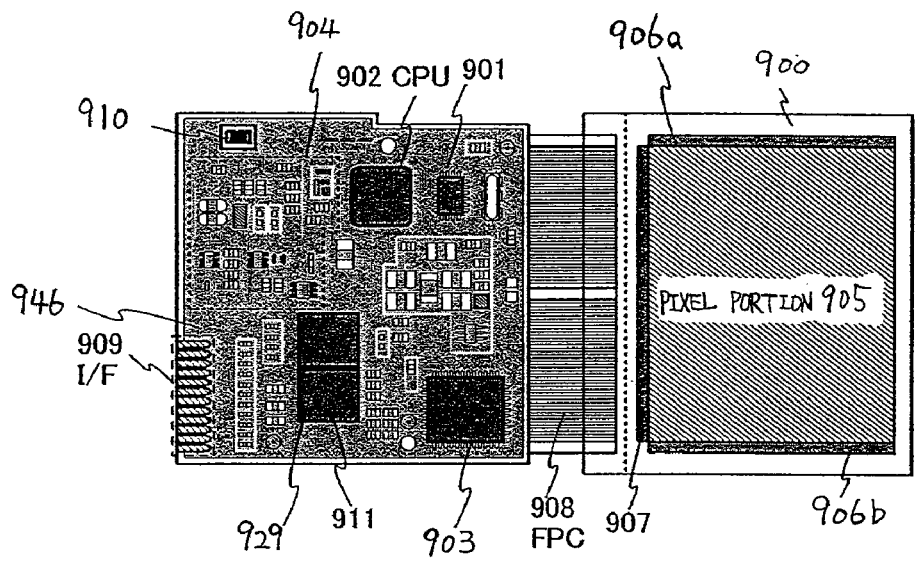
FIGS. 10A and 10B show configurations of a module of a light emitting device which is incorporated in a mobile phone.

FIG. 10A shows an internal structure of a mobile phone as an example of an electronic device to which the light emitting device of the invention is applied. A module of the mobile phone shown in FIG. 10A includes a printed wiring board 946 mounting a controller 901, a CPU 902, a memory 911, a power supply circuit 903, an audio processing circuit 929, a transmitter/receiver circuit 904, and other elements such as a resistor, a buffer, and a capacitor. The printed wiring board 946 is connected to a panel 900 through an FPC 908. The panel 900 includes an pixel portion 905 including pixels each having a light emitting element, a first scan driver circuit 906a and a second scan driver circuit 906b for selecting the pixel in the pixel portion 905, and a signal driver circuit 907 for supplying a video signal to the selected pixel.

Power supply voltages and a variety of signals input from a key board are supplied to the printed wiring board 946 through an interface (I/F) for printed wiring board 909 having a plurality of input terminals. Also, an antenna port 910 for transmitting/receiving signals to/from an antenna is disposed on the printed wiring board 946.

Although the printed wiring board 946 is connected to the panel 900 through the FPC 908, the invention is not limited to this structure. It is also possible to use COG bonding in order to mount the controller 901, the audio processing circuit 929, the memory 911, the CPU 902, or the power supply circuit 903 directly onto the panel 900.

In the printed wiring board 946, power supply voltages and signals may be disrupted by noise, or the rising edge of signals are delayed due to the capacitance between lead wirings, the resistance of the wirings, and the like. In order to avoid this problem, a variety of elements such as a capacitor and a buffer may be disposed on the printed wiring board 946.

Figure 10B:
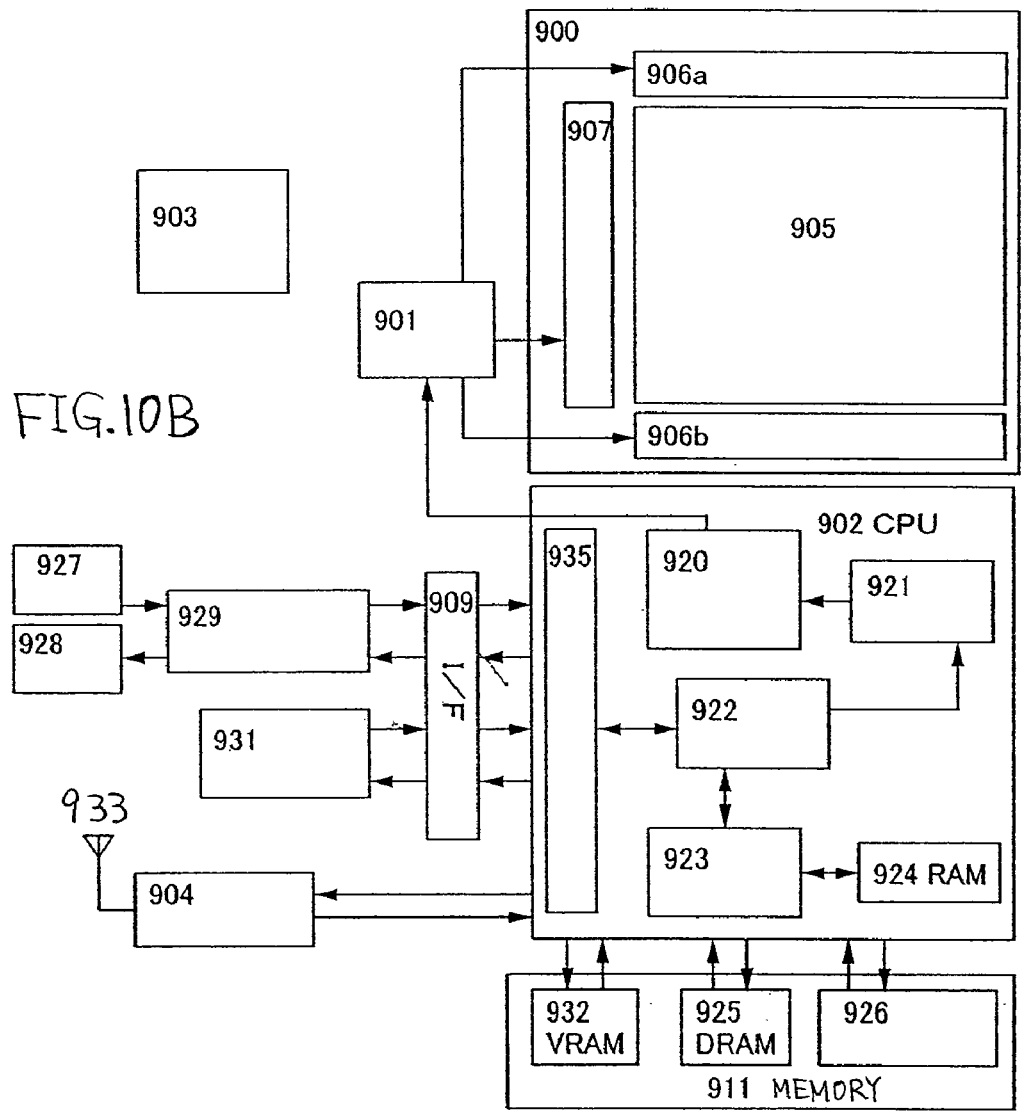

FIG. 10B shows a block diagram of the module shown in FIG. 10A.

The memory 911 of this embodiment includes a VRAM 932, a DRAM 925, a flash memory 926, and the like. The VRAM 932 stores image data to be displayed on the panel, the DRAM 925 stores image data or audio data, and the flash memory 926 stores various programs.

The power supply circuit 903 generates power supply voltages to be supplied to the panel 900, the controller 901, the CPU 902, the audio processing circuit 929, the memory 911, and the transmitter/receiver circuit 904. The power supply circuit 903 may include a current source depending on the specification of the panel.

The CPU 902 includes a control signal generating circuit 920, a decoder 921, a register 922, an arithmetic circuit 923, a RAM 924, an interface 935 for CPU, and the like. Various signals input to the CPU 902 through the interface 935 are, after being stored in the register 922 once, output to the arithmetic circuit 923, the decoder 921, and the like. The arithmetic circuit 923 performs an operation based on the input signal, and specifies a unit to send a variety of commands. Meanwhile, the signal input to the decoder 921 is decoded, and then input to the control signal generating circuit 920. The control signal generating circuit 920 generates signals including a variety of commands based on the input signal, and sends them to the specified unit by the arithmetic circuit 923 such as to the memory 911, the transmitter/receiver circuit 904, the audio processing circuit 929, and the controller 901.

Each of the memory 911, the transmitter/receiver circuit 904, the audio processing circuit 929, and the controller 901 operates in accordance with the sent commands. The description thereof is made in brief below.

Signals input from a keyboard 931 are sent to the CPU 902 mounted on the printed wiring board 946 through the interface 909. The control signal generating circuit 920 converts image data which is stored in the VRAM 932 into a predetermined format according to the signals sent from the keyboard 931, and then sends it to the controller 901.

The controller 901 processes the signals including the image data sent from the CPU 902 in accordance with the specification of the panel, and supplies them to the panel 900. The controller 901 also generates a Hsync signal, a Vsync signal, a clock signal CLK, an alternating voltage (AC Cont), and a switching signal L/R based on a power supply voltage input from the power supply circuit 903 or various signals input from the CPU 902, and supplies them to the panel 900.

The transmitter/receiver circuit 904 processes signals which are transmitted/received as signal waves in an antenna 933. Specifically, it includes a high-frequency circuit such as an isolator, a bandpass filter, a VCO (Voltage Controlled Oscillator), an LPF (Low Pass Filter), a coupler, and a balun. Among the signals which are transmitted/received in the transmitter/receiver circuit 904, those including audio data are transmitted to the audio processing circuit 929 according to the command from the CPU 902.

The signals including audio data which are transmitted according to the command from the CPU 902 is demodulated into an audio signal in the audio processing circuit 929, and then transmitted to a speaker 928. Audio signals transmitted from a microphone 927 are modulated in the audio processing circuit 929, and then transmitted to the transmitter/receiver circuit 904 according to the command from the CPU 902.

The controller 901, the CPU 902, the power supply circuit 903, the audio processing circuit 929, and the memory 922 are implemented as a package of the invention. The invention can be applied to any circuits other than high-frequency circuits such as an isolator, a bandpass filter, a VCO (Voltage Controlled Oscillator), an LPF (Low Pass Filter), a coupler, and a balun.

This embodiment can be combined with Embodiments 1 to 3.

Embodiment 5

Described in this embodiment is a top plan view of the pixel shown in FIG. 1.

Figure 12:
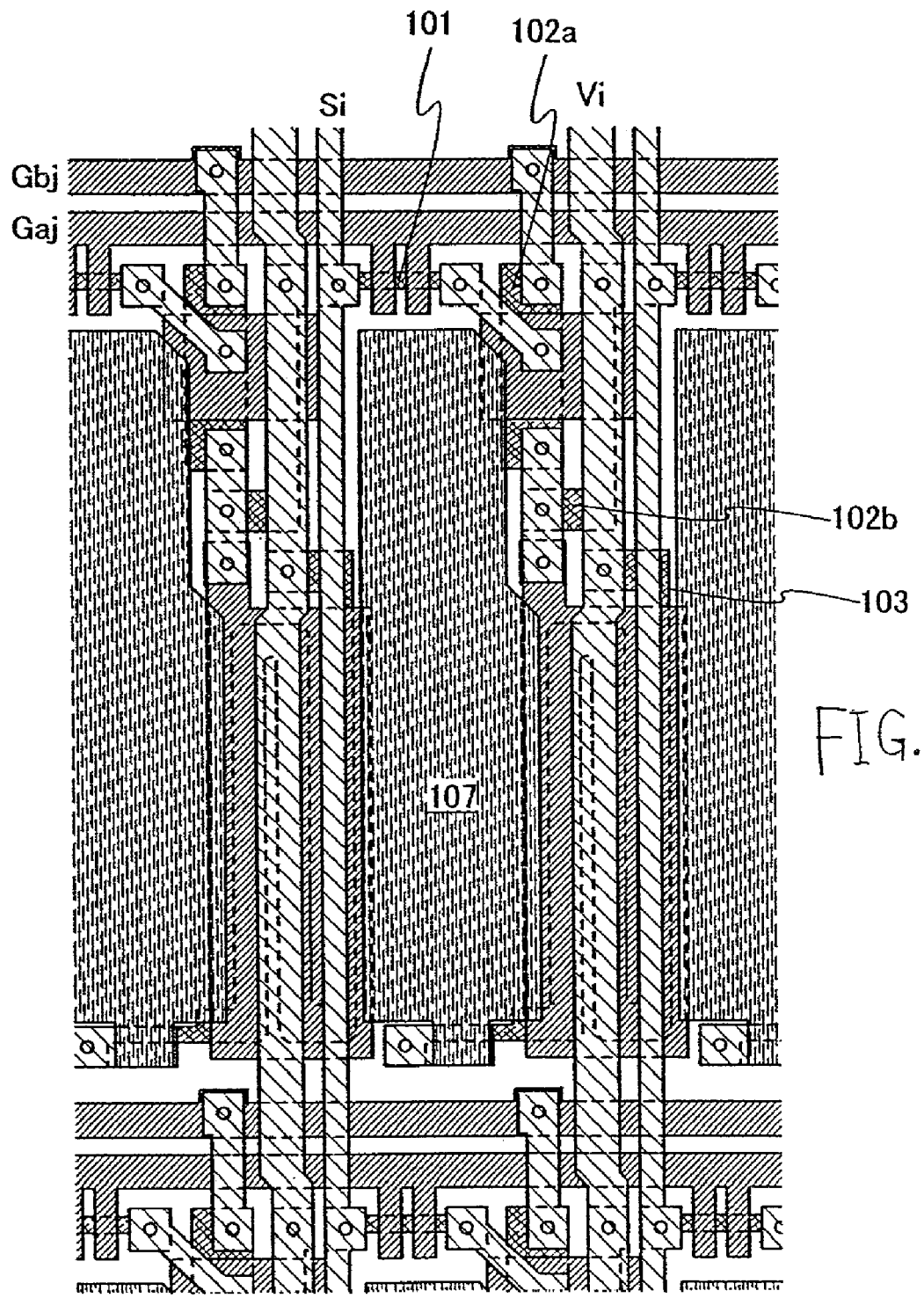
FIG. 12 shows a top plan view of a pixel of the light emitting device of the invention.

FIG. 12 shows a top plan view of a pixel of this embodiment. Si denotes a signal line, Vi denotes a power supply line, Gaj denotes a first scan line, and Gbj denotes a second scan line. In this embodiment, the signal line Si and the power supply line Vi are formed in the same conductive film, and the first scan line Gaj and the second scan line Gbj are formed in the same conductive film. A part of the first scan line Gaj functions as a gate electrode of the switching transistor 101. An active layer of the driving transistor 103 is curved so that its L becomes larger than W. Reference numeral 107 denotes a pixel electrode, and light is emitted in its overlapped area (light emitting area) with a light emitting layer and a cathode (neither of them is shown).

It is to be noted that the top plan view shown in this embodiment is only an example, and the invention is, needless to say, not limited to this.

This embodiment can be combined with Embodiments 1 to 4.

Embodiment 6

Described in this embodiment is a pixel configuration and its operation of the pixel shown in FIG. 1, in which each source of the second current controlling transistor and the driving transistor is supplied with a potential from different wirings.

Figure 13:
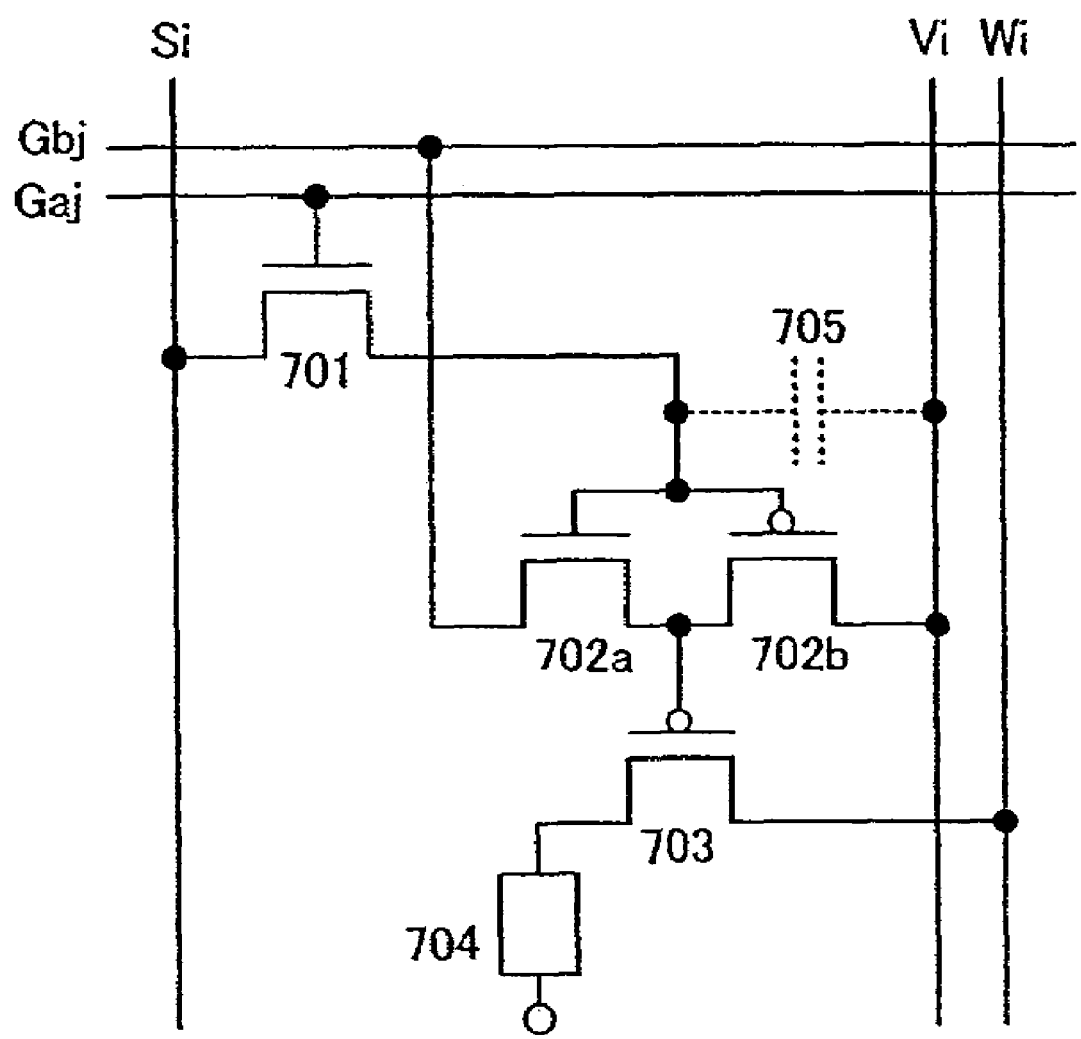
FIG. 13 shows an embodiment mode of a pixel of the light emitting device of the invention.

FIG. 13 shows a circuit diagram of a pixel of this embodiment. Reference numeral 701 denotes a switching transistor, 702a denotes a first current controlling transistor, 702b denotes a second current controlling transistor, 703 denotes a driving transistor, 704 denotes a light emitting element, and 705 denotes a capacitor. It should be noted that the capacitor 705 is not necessarily disposed in the light emitting device of the invention. Although the connection between each element is the same as in FIG. 1, the source of the second current controlling transistor 702b is connected to the first power supply line Vi and the source of the driving transistor 703 is connected to a second power supply line Wi (i=1 to x) in the pixel shown in FIG. 13. The first power supply line Vi is supplied with the third potential and the second power supply line Wi is supplied with the fourth potential.

Although the switching transistor 701 is an N-channel transistor in FIG. 13, it may be a P-channel transistor as well. Also, although the first current controlling transistor 702a is an N-channel transistor, the second current controlling transistor 702b is a P-channel transistor, and the driving transistor 703 is a P-channel transistor in FIG. 13, the first current controlling transistor 702a may be a P-channel transistor, the second current controlling transistor 702b may be an N-channel transistor, and the driving transistor 703 may be an N-channel transistor as well.

The third potential supplied to the first power supply line Vi and the fourth potential supplied to the second power supply line Wi have levels which are high enough to turn OFF the driving transistor 703 when the second current controlling transistor 702a is turned ON. Meanwhile, the third potential supplied to the first power supply line Vi and the potential supplied to the counter electrode of the light emitting element 704 are set to have levels so that current flows into the light emitting element 704 in the forward bias direction when the driving transistor 703 is ON.

An operation of the pixel shown in FIG. 13 can be divided into a write period, a data storage period, and an erase period.

However, when the driving transistor 703 is a P-channel transistor, the first potential supplied to the second scan line Gbj (j=1 to y) is set lower than the sum of the threshold voltage and the potential (fourth potential) of the second power supply line Wi (i=1 to x) so that the gate voltage Vgs of the driving transistor 703 becomes lower than the threshold voltage. In the erase period, the second potential supplied to the second scan line Gbj is set higher than the sum of the threshold voltage and the potential (fourth potential) of the second power supply line Wi so that the gate voltage Vgs of the driving transistor 703 becomes higher than the threshold voltage. Meanwhile, when the second current controlling transistor 702b which is a P-channel transistor has been OFF since the write period, it is held OFF even when its gate potential becomes higher. On the other hand, when the second current controlling transistor 702b has been ON since the write period, it is turned OFF when its gate potential becomes higher or held ON depending on the threshold voltage. However, in either case of the second current controlling transistor 702b being OFF or ON, the driving transistor 703 is held OFF, thus the light emitting element 704 emits no light in the erase period.

On the other hand, when the driving transistor 703 is an N-channel transistor, the first potential supplied to the second scan line Gbj (j=1 to y) is set higher than the sum of the threshold voltage and the potential (fourth potential) of the second power supply line Wi (i=1 to x) so that the gate voltage Vgs of the driving transistor 703 becomes higher than the threshold voltage. In the erase period, the second potential supplied to the second scan line Gbj is set lower than the sum of the threshold voltage and the potential (fourth potential) of the second power supply line Wi so that the gate voltage Vgs of the driving transistor 703 becomes lower than the threshold voltage. Meanwhile, when the second current controlling transistor 702b which is an N-channel transistor has been OFF since the write period, it is held OFF even when its gate potential becomes lower. On the other hand, when the second current controlling transistor 702b has been ON since the write period, it is turned OFF when its gate potential becomes higher or held ON depending on the threshold voltage. However, in either case of the second current controlling transistor 702b being OFF or ON, the driving transistor 703 is held OFF, thus the light emitting element 704 emits no light in the erase period.

As set forth above, when each source of the second current controlling transistor and the driving transistor is supplied with a potential from different wirings, the gate voltage Vgs of the driving transistor 703 can be controlled so that the driving transistor 703 is turned OFF without fail regardless of the threshold voltage when the second current controlling transistor 702b is ON.

This embodiment can be combined with Embodiments 1 to 5.

Embodiment 7

Since a light emitting device using light emitting elements is a self-luminous type, it exhibits high visibility and a wide viewing angle under the bright light. Therefore, it can be applied to display portions of various electronic devices.

Electronic devices using the light emitting device of the invention include a video camera, a digital camera, a goggle type display, (head mounted display), a navigation system, a sound reproducing device (car audio, audio set, and the like), a notebook personal computer, a game player, a portable information terminal (mobile computer, mobile phone, portable game player, electronic book, and the like), an image reproducing device provided with a recording medium (specifically, a device equipped with a display capable of reproducing the recording medium such as a Digital Versatile Disk (DVD) and displaying the image thereof), and the like. In particular, the light emitting device is preferably applied to a portable information terminal which requires a wide viewing angle as it is frequently seen obliquely. Specific examples of these electronic devices are shown in FIGS. 11A to 11E.

FIG. 11A illustrates a portable information terminal which includes a main body 2001, a display portion 2002, an operating key 2003, a modem 2004, and the like. Although the modem 2004 is removable in the portable information terminal shown in FIG. 10A, it may be incorporated into the main body 2001 as well. The light emitting device of the invention can be applied to the display portion 2002.

FIG. 11B illustrates a mobile phone which includes a main body 2101, a display portion 2102, an audio input portion 2103, an audio output portion 2104, an operating key 2105, an external connecting port 2106, an antenna 2107, and the like. By displaying white text on the black background in the display portion 2102, power consumption of the mobile phone can be suppressed. The light emitting device of the invention can be applied to the display portion 2102.

FIG. 11C illustrates an electronic card which includes a main body 2201, a display portion 2202, a connecting terminal 2203, and the like. The light emitting device of the invention can be applied to the display portion 2202. It should be noted that although the electronic card shown in FIG. 11C is a contact type, the invention can be applied to an electronic card of a non-contact type or a compatible type having both contact and non-contact functions as well.

FIG. 11D illustrates an electronic book which includes a main body 2301, a display portion 2302, an operating key 2303, and the like. The main body 2301 may incorporate a modem as well. The light emitting device of the invention can be applied to the display portion 2302.

FIG. 11E illustrates a seat personal computer which includes a main body 2401, a display portion 2402, a keyboard 2403, a touch pad 2404, an external connecting port 2405, a power plug 2406, and the like. The light emitting device of the invention can be applied to the display portion 2402.

As described above, the application range of the invention is so wide that the invention can be applied to various electronic devices in all fields. The electronic devices according to this embodiment can employ any configurations of the light emitting device described in Embodiments 1 to 6.

What is claimed is:

1. A light emitting device comprising:
   a substrate;
   first, second, third and fourth transistors provided over the substrate;
   a bank provided over at least the fourth transistor; and
   a light emitting layer provided beyond the bank so that the light emitting layer is provided in an opening, the light emitting layer connected with the fourth transistor,
   wherein drains of the second transistor and the third transistor are connected to each other,
   wherein the first transistor controls a video signal inputted to each gate of the second transistor and the third transistor,
   wherein sources of the third transistor and the fourth transistor are connected to each other,
   wherein the drains of the second transistor and the third transistor are connected to a gate of the fourth transistor,
   wherein the fourth transistor controls a current amount supplied to the light emitting layer according to each drain potential of the second transistor and the third transistor, and
   wherein a light emitted from the light emitting layer is outputted from a first side of the light emitting device though the substrate, and is outputted from a second side of the light emitting device opposite to the first side.

2. A light emitting device according to claim 1 wherein the light emitting layer is provided between an anode and a cathode.

3. A light emitting device according to claim 1 wherein the light emitting device is incorporated into one selected from the group consisting of a portable information terminal, a mobile phone, an electronic card, an electronic book, and a computer.

4. A light emitting device according to claim 1 further comprising a light-transmissive covering material provided over the bank and the light emitting layer wherein the light emitted from the light emitting layer is outputted from the first side of the light emitting device through the substrate, and is outputted from the second side of the light emitting device through the light-transmissive covering material.

5. A light emitting device according to claim 1 further comprising a color filter through which the light emitted from the light emitting layer is outputted from the first side of the light emitting device through the substrate.

6. A light emitting device according to claim 5 wherein the light emitting layer is provided over the color filter.

7. A light emitting device according to claim 4 wherein the light-transmissive covering material is provided with a color filter through which the light emitted from the light emitting layer is outputted from the second side of the light emitting device through the light-transmissive covering material.

8. A light emitting device according to claim 7 wherein the color filter is provided over the light emitting layer.

9. A light emitting device comprising:
   a substrate;
   first, second, third and fourth transistors provided over the substrate;

a bank comprising an organic resin film provided over at least the fourth transistor; and a light emitting layer provided beyond the bank so that the light emitting layer is provided in an opening, the light emitting layer connected with the fourth transistor, wherein drains of the second transistor and the third transistor are connected to each other, wherein the first transistor controls a video signal inputted to each gate of the second transistor and the third transistor, wherein sources of the third transistor and the fourth transistor are connected to each other wherein the drains of the second transistor and the third transistor are connected to a gate of the forth transistor, wherein the fourth transistor controls a current amount supplied to the light emitting layer according to each drain potential of the second transistor and the third transistor, and wherein a light emitted from the light emitting layer is outputted from a first side of the light emitting device through the substrate, and is outputted from a second side of the light emitting device opposite to the first side.

10. A light emitting device according to claim 9 wherein the light emitting layer is provided between an anode and a cathode.

11. A light emitting device according to claim 9 wherein the light emitting device is incorporated into one selected from the group consisting of a portable information terminal, a mobile phone, an electronic card, an electronic book, and a computer.

12. A light emitting device according to claim 9 further comprising a light-transmissive covering material provided over the bank and the light emitting layer wherein the light emitted from the light emitting layer is outputted from the first side of the light emitting device through the substrate, and is outputted from the second side of the light emitting device through the light-transmissive covering material.

13. A light emitting device according to claim 9 further comprising a color filter through which the light emitted from the light emitting layer is outputted from the first side of the light emitting device through the substrate.

14. A light emitting device according to claim 13 wherein the light emitting layer is provided over the color filter.

15. A light emitting device according to claim 12 wherein the light-transmissive covering material is provided with a color filter through which the light emitted from the light emitting layer is outputted from the second side of the light emitting device through the light-transmissive covering material.

16. A light emitting device according to claim 15 wherein the color filter is provided over the light emitting layer 17. A light emitting device comprising:

a substrate;

first, second, third and fourth transistors provided over the substrate;

a bank provided over at least the fourth transistor; and a light emitting layer provided beyond the bank so that the light emitting layer is provided in an opening, the light emitting layer connected with the fourth transistor, wherein the first transistor controls a video signal inputted to each gate of the second transistor and the third transistor, wherein the fourth transistor controls a current amount supplied to the light emitting layer according to each drain potential of the second transistor and the third transistor, and wherein a light emitted from the light emitting layer is outputted from a first side of the light emitting device through the substrate, and is outputted from a second side of the light emitting device opposite to the first side.

18. A light emitting device according to claim 17 wherein the light emitting layer is provided between an anode and a cathode.

19. A light emitting device according to claim 17 wherein the light emitting device is incorporated into one selected from the group consisting of a portable information terminal, a mobile phone, an electronic card, an electronic book, and a computer.

20. A light emitting device according to claim 17 further comprising a light-transmissive covering material provided over the bank and the light emitting layer wherein the light emitted from the light emitting layer is outputted from the first side of the light emitting device through the substrate, and is outputted from the second side of the light emitting device through the light-transmissive covering material.

21. A light emitting device according to claim 17 further comprising a color filter through which the light emitted from the light emitting layer is outputted from the first side of the light emitting device through the substrate.

22. A light emitting device according to claim 21 wherein the light emitting layer is provided over the color filter.

23. A light emitting device according to claim 20 wherein the light-transmissive covering material is provided with a color filter through which the light emitted from the light emitting layer is outputted from the second side of the light emitting device through the light-transmissive covering material.

24. A light emitting device according to claim 23 wherein the color filter is provided over the light emitting layer.

25. A light emitting device according to claim 1, wherein the third transistor and the fourth transistor have the same conductivity.

26. A light emitting device according to claim 1, wherein the second transistor and the third transistor have the opposite conductivity.

27. A light emitting device according to claim 1, wherein the fourth transistor operates in a saturation region.

28. A light emitting device according to claim 1, wherein the sources of the third transistor and the fourth transistor are connected to a power supply line.

29. A light emitting device according to claim 1, wherein a ratio of a channel length to a channel width of the fourth transistor is five or more.

30. A light emitting device according to claim 9, wherein the third transistor and the fourth transistor have the same conductivity.

31. A light emitting device according to claim 9, wherein the second transistor and the third transistor have the opposite conductivity.

32. A light emitting device according to claim 9, wherein the fourth transistor operates in a saturation region.

33. A light emitting device according to claim 9, wherein the sources of the third transistor and the fourth transistor are connected to a power supply line.

34. A light emitting device according to claim 9, wherein a ratio of a channel length to a channel width of the fourth transistor is five or more.

35. A light emitting device according to claim 17, wherein the third transistor and the fourth transistor have the same conductivity.

36. A light emitting device according to claim 17, wherein the second transistor and the third transistor have the opposite conductivity.

37. A light emitting device according to claim 17, wherein the fourth transistor operates in a saturation region 38. A light emitting device according to claim 17, wherein the sources of the third transistor and the fourth transistor are connected to a power supply line, 39. A light emitting device according to claim 17, wherein a ratio of a channel length to a channel width of the fourth transistor is five or more.

40. A light emitting device comprising:
a substrate;
first, second, third and fourth transistors provided over the substrate;
a bank provided over at least the fourth transistor; and
a light emitting layer provided beyond the bank so that the light emitting layer is provided in an opening, the light emitting layer connected with the fourth transistor,
wherein the first transistor controls a video signal inputted to each gate of the second transistor and the third transistor,
wherein the fourth transistor controls a current amount supplied to the light emitting layer according to each drain potential of the second transistor and the third transistor,
wherein a light emitted from the light emitting layer is outputted from a first side of the light emitting device through the substrate, and is outputted from a second side of the light emitting device opposite to the first side, and
wherein the fourth transistor is a driving transistor.

41. A light emitting device according to claim 40, wherein the third transistor and the fourth transistor have the same conductivity.

42. A light emitting device according to claim 40, wherein the second transistor and the third transistor have the opposite conductivity.

43. A light emitting device according to claim 40, wherein the fourth transistor operates in a saturation region.

44. A light emitting device according to claim 40, wherein the sources of the third transistor and the fourth transistor are connected to a power supply line.

45. A light emitting device according to claim 40, wherein a ratio of a channel length to a channel width of the fourth transistor is five or more.

* * * * *